(12) United States Patent
Hayashida et al.

(10) Patent No.: US 9,184,069 B2
(45) Date of Patent: Nov. 10, 2015

(54) HEATING APPARATUS, SUBSTRATE PROCESSING APPARATUS EMPLOYING THE SAME, METHOD OF MANUFACTURING SEMICONDUCTOR DEVICES, AND INSULATOR

(75) Inventors: Akira Hayashida, Toyama (JP);
Masaaki Ueno, Toyama (JP); Masakazu Shimada, Toyama (JP); Masashi Sugishita, Toyama (JP); Toshimitsu Miyata, Toyama (JP); Kimio Kitamura, Osaka (JP); Kenji Tanaka, Osaka (JP); Jyunichi Nishihara, Osaka (JP)

(73) Assignees: Hitachi Kokusai Electric Inc., Tokyo (JP); Teitokusha Co., Ltd., Osaka (JP)

( * ) Notice: Subject to any disclaimer, the term of this patent is extended or adjusted under 35 U.S.C. 154(b) by 1617 days.

(21) Appl. No.: 12/213,824

(22) Filed: Jun. 25, 2008

(65) Prior Publication Data

US 2009/0014435 A1 Jan. 15, 2009

(30) Foreign Application Priority Data

Jun. 25, 2007 (JP) .................................. 2007-166997
Jun. 12, 2008 (JP) .................................. 2008-154357

(51) Int. Cl.
*C23C 16/50* (2006.01)
*C23C 16/00* (2006.01)
(Continued)

(52) U.S. Cl.
CPC .... *H01L 21/67109* (2013.01); *H01L 21/67248* (2013.01); *H01L 22/12* (2013.01); *H01L 21/67303* (2013.01); *Y10T 29/41* (2015.01)

(58) Field of Classification Search
CPC .............................. F27B 7/0025; C30B 31/12
USPC ........ 118/715, 725–733; 156/345.24, 345.33, 156/345.51–345.55
See application file for complete search history.

(56) References Cited

U.S. PATENT DOCUMENTS 5,128,515 A * 7/1992 Tanaka .......................... 219/390
5,474,613 A * 12/1995 Pickering et al. ............. 118/725
(Continued)

FOREIGN PATENT DOCUMENTS

| JP | 07-018446 A | 1/1995 |
| JP | 2000-070664 A | 3/2000 |

(Continued)

OTHER PUBLICATIONS

JPO Notification of Reason for Refusal, App. No. 2008-154357, Dispatch No. 477656, Dispatch Date Aug. 11, 2009 (4 pages total).

*Primary Examiner* — Maureen Passey
*Assistant Examiner* — Tiffany Nuckols
(74) *Attorney, Agent, or Firm* — Michael Best & Friedrich LLP

(57) ABSTRACT

A heating apparatus comprises a heating element, an inner shell for supporting the heating element, an outer shell disposed along the outer boundary of the inner shell, a cooling medium passage for conveying a cooling medium between the inner shell and the outer shell, a first opening provided in the inner shell, a second opening provided in the outer shell, and a partition arranged to extend from the first opening to the second opening for developing at least a space separated from the cooling medium passage and between the inner shell and the outer shell. The heating apparatus further comprises an insulator for shutting up a gap provided between the partition and the second opening.

18 Claims, 15 Drawing Sheets

(51) Int. Cl.
*C23F 1/00* (2006.01)
*H01L 21/306* (2006.01)
*H01L 21/67* (2006.01)
*H01L 21/66* (2006.01)
*H01L 21/673* (2006.01)

(56) References Cited

U.S. PATENT DOCUMENTS 5,676,869 A * 10/1997 Nakayama et al. ........... 219/390
6,224,678 B1 * 5/2001 Ramos et al. ................. 118/715
7,820,118 B2 * 10/2010 Yamazaki et al. ........... 422/198

FOREIGN PATENT DOCUMENTS

| | | |
|---|---|---|
| JP | 2004-228381 A | 8/2004 |
| JP | 2004-311648 A | 11/2004 |
| WO | WO-2006-134862 A1 | 12/2006 |
| WO | WO 2007018142 A1 * | 2/2007 |
| WO | WO-2007/023855 A1 | 3/2007 |

* cited by examiner

HEATING APPARATUS, SUBSTRATE PROCESSING APPARATUS EMPLOYING THE SAME, METHOD OF MANUFACTURING SEMICONDUCTOR DEVICES, AND INSULATOR

BACKGROUND OF THE INVENTION

1. Field of the Invention

The present invention relates to a semiconductor device manufacturing technology or more particularly a heat processing technology for processing a substrate to be processed while being heated up by heating elements in a processing chamber and also relates to a heating apparatus, a substrate processing apparatus employing the heating apparatus, a method of manufacturing semiconductor devices, and an insulator.

2. Description of the Related Art

FIG. 1 is a schematic cross sectional view of a processing furnace 500 equipped with a conventional heating apparatus. The conventional heating apparatus comprises a metallic casing 501 arranged of substantially a tubular shape with the upper end closed, a thermal insulator material 502 arranged of substantially a tubular shape and disposed at the inside of the casing 501, and heating wires 503 mounted to the inner wall of the thermal insulator material 502. The heating apparatus contains a thermal equalizer tube 504 and a reactor tube 505 which acts as a processing chamber and the action of heating up a wafer 506 in a given manner is carried out in the reactor tube 505.

It has been demanded in the metallic wiring process (Cu annealing etc.) to decrease the processing temperature (to not higher than 300° C.) and improve the throughput. Therefore, the shortening of the temperature increase and decrease of the wafer is essential. However, for responding to the above demand, such a conventional heating apparatus as shown in FIG. 1 employs a large amount of thermally insulating materials for permitting the use of heaters in middle and high temperature ranges, hence being low in the temperature increase and decrease response and hardly improving the throughput. It is thus desired to provide an improved heating apparatus which is high in the thermal response.

Disclosed in Patent Citation 1 is a substrate processing apparatus which allows its heating space to be cooled down rapidly with the cooling gas supplied through the pins which are provided to extend through the heating elements. The thermal response in the heating apparatus can thus be improved by modifying the cooling property. Another substrate processing apparatus disclosed in Patent Citation 2 comprises heating elements disposed in a heater unit to surround the processing chamber, a first reflector disposed to surround the heating elements, and a second reflector disposed to surround the first reflector as spaced at the outer side by a distance from the first reflector so that the efficiency of increasing and decreasing the temperature in the processing chamber can be improved.

It is essential for improving the thermal response in the heating apparatus to ease the adverse effect of reflected or radiated heat on the temperature detector in order to increase the accuracy of the temperature measurement. Patent Citation 3 has proposed, without significant success, some arrangements applicable to the heating apparatus shown in FIG. 1. Patent Citation 4 discloses that the thermally insulating materials for inhibiting the radiation of heat at the cooling passage of the temperature detector are disposed separately while the accuracy of the temperature measurement remains not improved.

Patent Citation 1: WO2007/023855.
Patent Citation 2: Japanese Patent Laid-open Publication No. 2004-311648.
Patent Citation 3: Japanese Patent Laid-open Publication No. 2004-228381.
Patent Citation 4: Japanese Patent Laid-open Publication No. (Heisei) 7-18446.

SUMMARY OF THE INVENTION

It is hence an object of the present invention, in view of the conventional aspect, to improve the thermal response of a heating apparatus through increasing the accuracy of the temperature measurement with the temperature detector.

For achievement of the above object of the present invention, a heating apparatus is provided comprising a heating element, an inner shell for supporting the heating element, an outer shell disposed along the outer boundary of the inner shell, a cooling medium passage for conveying a cooling medium between the inner shell and the outer shell, a first opening provided in the inner shell, a second opening provided in the outer shell, a partition arranged to extend from the first opening to the second opening for developing at least a space separated from the cooling medium passage and between the inner shell and the outer shell, and a insulator for shutting up a gap provided between the partition and the second opening.

The substrate processing apparatus according to the present invention can successfully improve the thermal response of the heating apparatus through increasing the accuracy of the temperature measurement with the temperature detectors.

Other objects, arrangements, and effects of the present invention will be apparent from the detailed description of the preferred embodiments described below.

DESCRIPTION OF THE PREFERRED EMBODIMENTS

Figure 1:
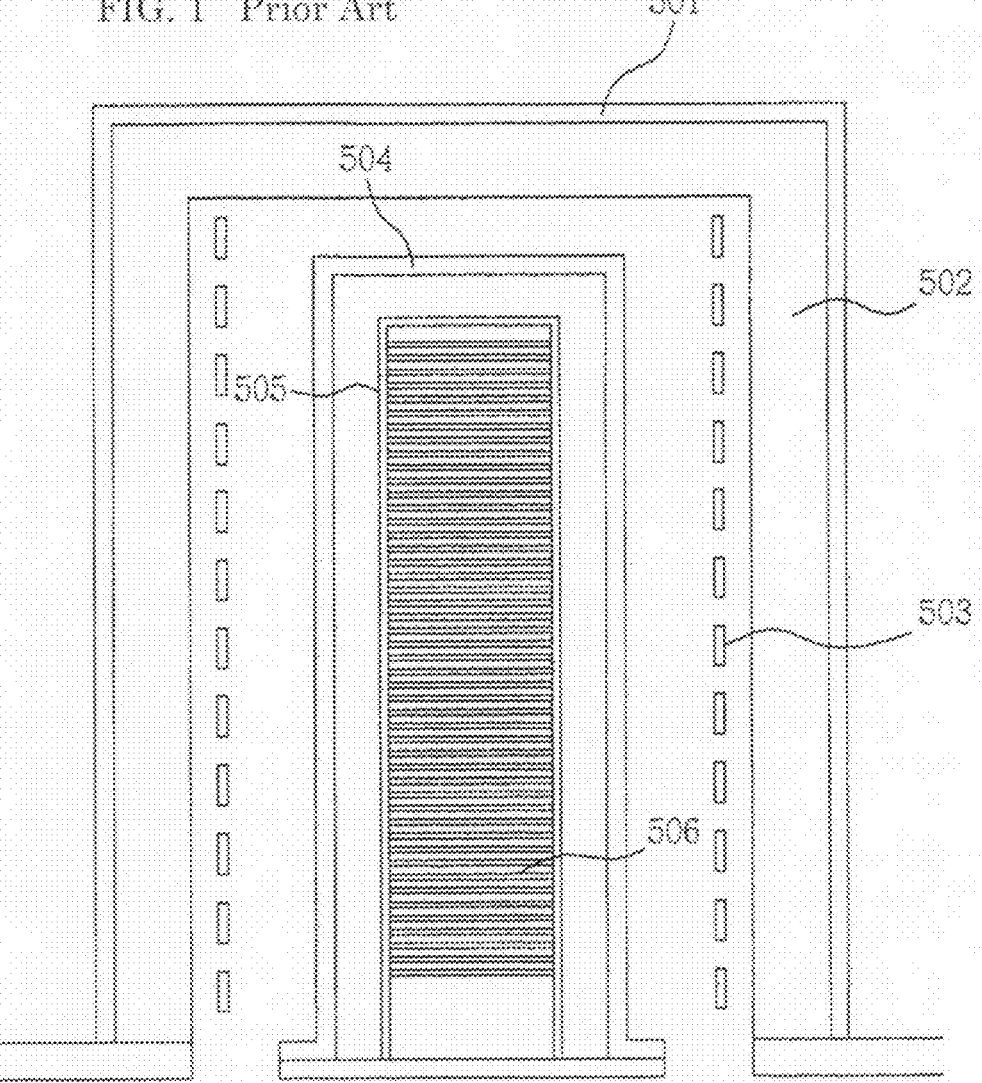
FIG. 1 is a schematic cross sectional view of a processing furnace using a convention heating apparatus.

The present invention will be described in more detail referring to the accompanying drawings.

One of the best modes for embodying the present invention will be described in the form of a first embodiment in conjunction with the drawings.

As shown in FIGS. 2 to 7, a substrate processing apparatus 1 comprises substantially a reactor container 309 acting as a processing chamber 308, a heating module 3 disposed at the outer periphery of the reactor container, and a main controller module 4.

The heating module 3 comprises substantially a ceiling 10, an intermediate unit 11 of a tubular shape, a lower case 12, a terminal case 13, and heating elements 20 disposed in the intermediate unit 11. The ceiling 10 has a discharge (exhaust gas) gas passage 81 of an elbow shape provided therein to open at the lower side and one side. A reflector 90 is disposed beneath the ceiling 10. The intermediate unit 11 has an inner shell 50 thereof supported throughout the circumference by an outer shell 60 for accommodating the heating elements 20 therein and is protected at the outer side with a decorative panel 70. The inner shell 50 and the outer shell 60 are made of an electrically conductive material such as stainless steel or any other metallic material.

A cooling gas infeed duct 7y is provided between the upper side of the intermediate unit 11 and a gas intake attachment 7x. An open/close valve 7a or more particularly a butterfly valve is mounted at the open end of the gas intake attachment 7x for opening and closing the flow passage. The gas intake attachment 7x is connected with a cooling gas supply conduit 7. A gas passage 14 is provided in a tubular shape between the inner shell 50 and the outer shell 60 for conveying the cooling medium. The cooling gas infeed duct 7y is communicated to the gas passage 14 by a group of conduits 61 disposed at substantially equal intervals in an annular arrangement. Also, the discharge passage 81 is communicated to a forced discharge conduit 8 equipped with a discharge blower 8a for forcibly discharging the gas from the internal or heating space provided in the heating apparatus 3. This allows the air or inert gas supplied from the cooling gas infeed conduit 7 to be conveyed as the cooling gas through the gas passage 14 and a set of insulator apertures, which will be explained later, to the heating space 18 before discharged from the forced discharge conduit 8.

The reactor container 309 comprises a thermal equalizer tube 315 and a reactor tube 310 arranged concentrically in the heating space 18 while the processing chamber 308 is formed in the reactor tube 310. A boat 300 on which the wafers 305 are horizontally placed in a stack is accommodated in the processing chamber 308. The boat 300 can be loaded into and out from the processing chamber 308 using a boat elevator which is not shown.

Also, the reactor tube 310 is communicated with a reactive gas infeed conduit 5x and a reacting gas discharge conduit 6x. The reactive gas infeed conduit 5x is equipped with a flow controller 5a while the reacting gas discharge conduit 6x is equipped with a pressure controller 6a. When a desired amount of the reactive gas has been introduced with the reactor tube 310 remaining at a predetermined pressure, the existing gas is discharged from a discharge-outlet 6y to the discharge conduit 6x before finally released to the outside of the processing chamber.

Another cooling gas supply conduit 5y is communicated with a thermal equalizer internal space 317 defined between the thermal equalizer 315 and the reactor tube 310. The cooling gas supply conduit 5y is equipped with a flow controller 5b. The open/close valve 7a is mounted to the gas intake attachment 7x. The forced discharge conduit 8 is equipped with the discharge blower 8a which acts as a discharging device. In brief, the cooling gas can controllably be supplied into both the thermal equalizer tube internal space 317 and the heating space 18.

The heating elements 20 are divided into a desired number of zones Z1 to Z5 arranged axially of the tubular shape of the intermediate unit 11 and can thus be controlled at each zone. Each zone is accompanied with a temperature detector for detecting the temperature at the zone. Alternatively, the zones of the heating elements 20 may be shaped in the same pattern for producing the heat equally throughout the zones.

The action at each section of the substrate processing apparatus 1 is controlled by the main controller module 4. For example, the condition of the processing the wafers 305 in the reactor tube 310 is monitored and controlled by the main controller module 4. The main controller module 4 comprises a temperature monitor 4a, a heating controller (heater controller) 4b, a reflection controller 4c, a first flow controller 4d, a pressure controller 4e for controlling the pressure in the reactor tube 310, a second flow controller 4f, a discharge controller 4g, and a drive controller 4h for controlling the mechanical movements including the boat elevator.

The temperature monitor 4a is designed for detecting the temperature of three, first to third, temperature detectors TC1 to TC3. The first temperature detector TC1 is mounted to each of the zones Z1 to Z5 as located close to the heating elements 20. The second temperature detector TC2 is mounted to each of the zones Z1 to Z5 as surrounding the reactor tube 310. The third temperature detector TC3 is mounted above the reactor tube 310 or at a particular location such as the upper center of the reactor tube 310.

The heating controller 4b is arranged responsive to the measurement of the temperature monitor 4a for controlling the heat generated by the heating elements 20 at each of the zones Z1 to Z5. The reflection controller 4c is arranged responsive to the measurement of the temperature monitor 4a for controlling the action of an actuator 99 for driving the reflector 90. More specifically, the reflection controller 4c controls the tilting of the reflecting member 91 mirror finished with its lower side thus to modify the concentration of reflected heat at the upper center of the reactor tube 310 for controlling the temperature.

The first flow controller 4d is designed for controlling the action of the flow controller 5a while the pressure controller 4e is designed for controlling the action of the pressure controller 6a thus to determine the supply and pressure of the reactive gas. The second flow controller 4f is designed for controlling the action of the flow controller 5b while the discharge controller 4g is designed for controlling the action of the open/close valve 7a and the discharge blower 8a thus to determine the supply and discharge of the cooling gas.

Figure 2:
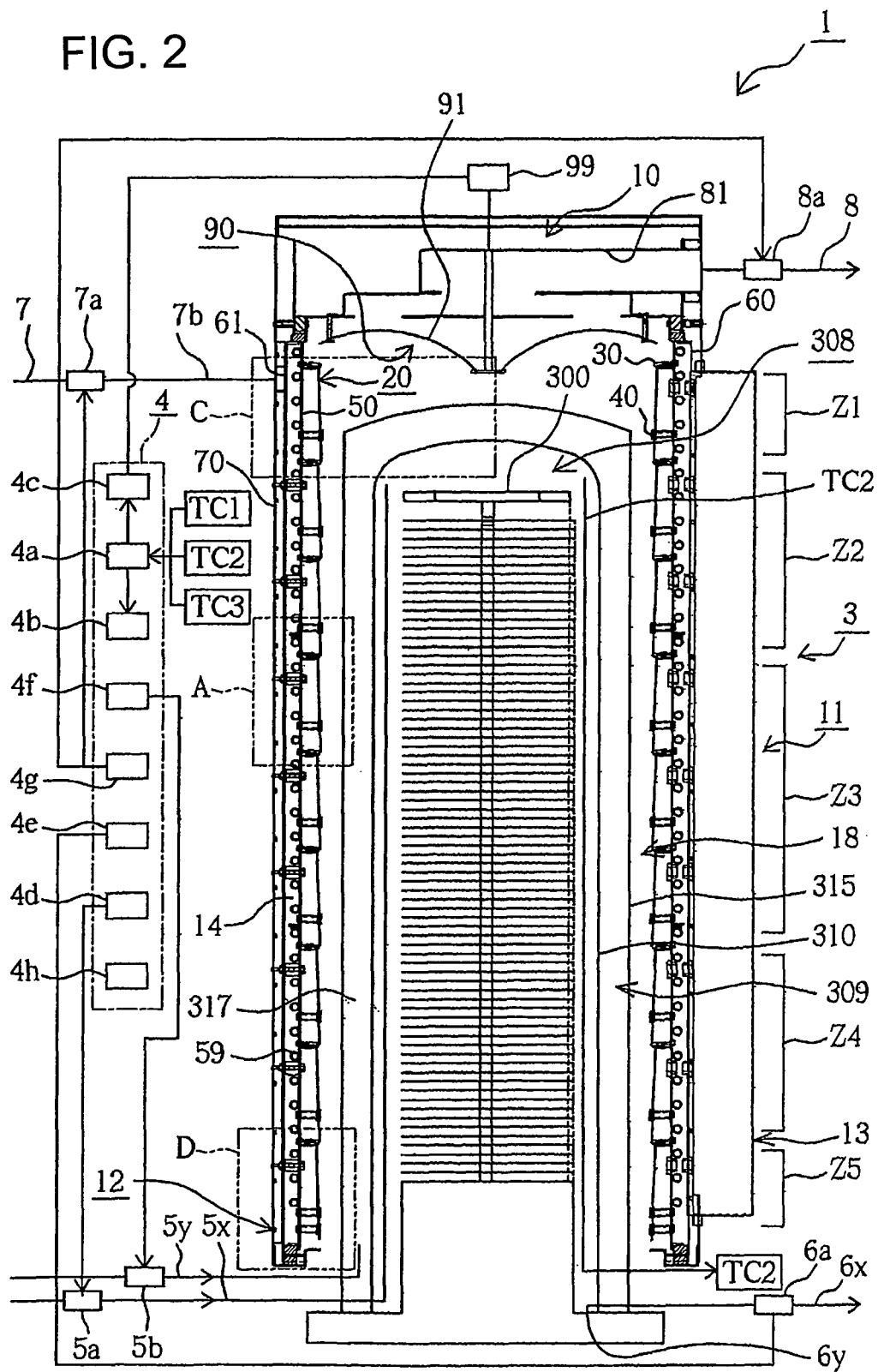
FIG. 2 is a longitudinally cross-sectional view schematically showing a substrate processing apparatus according to the present invention.
Figure 3:
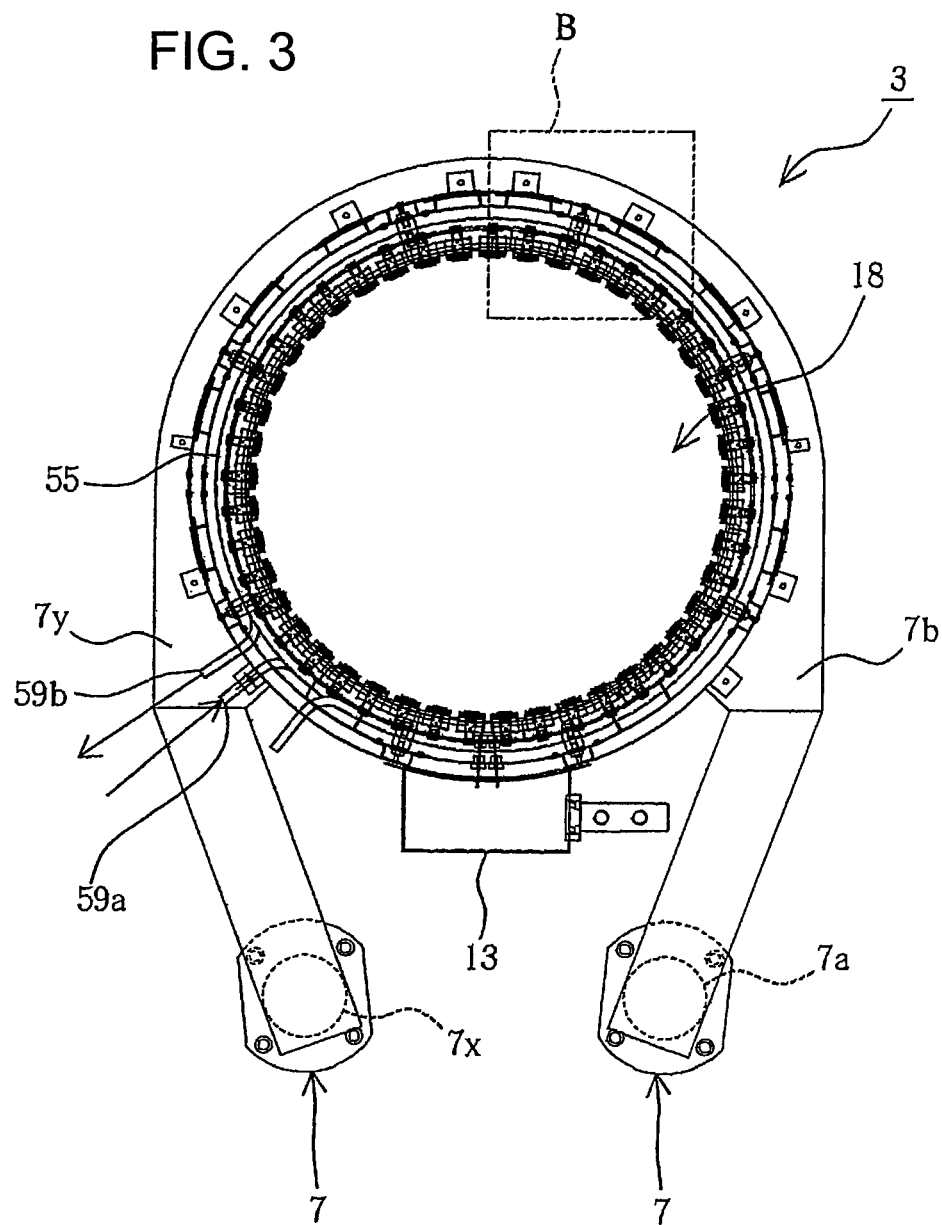
FIG. 3 is a transversely cross-sectional view of the proximity of a ceiling.
Figure 4:
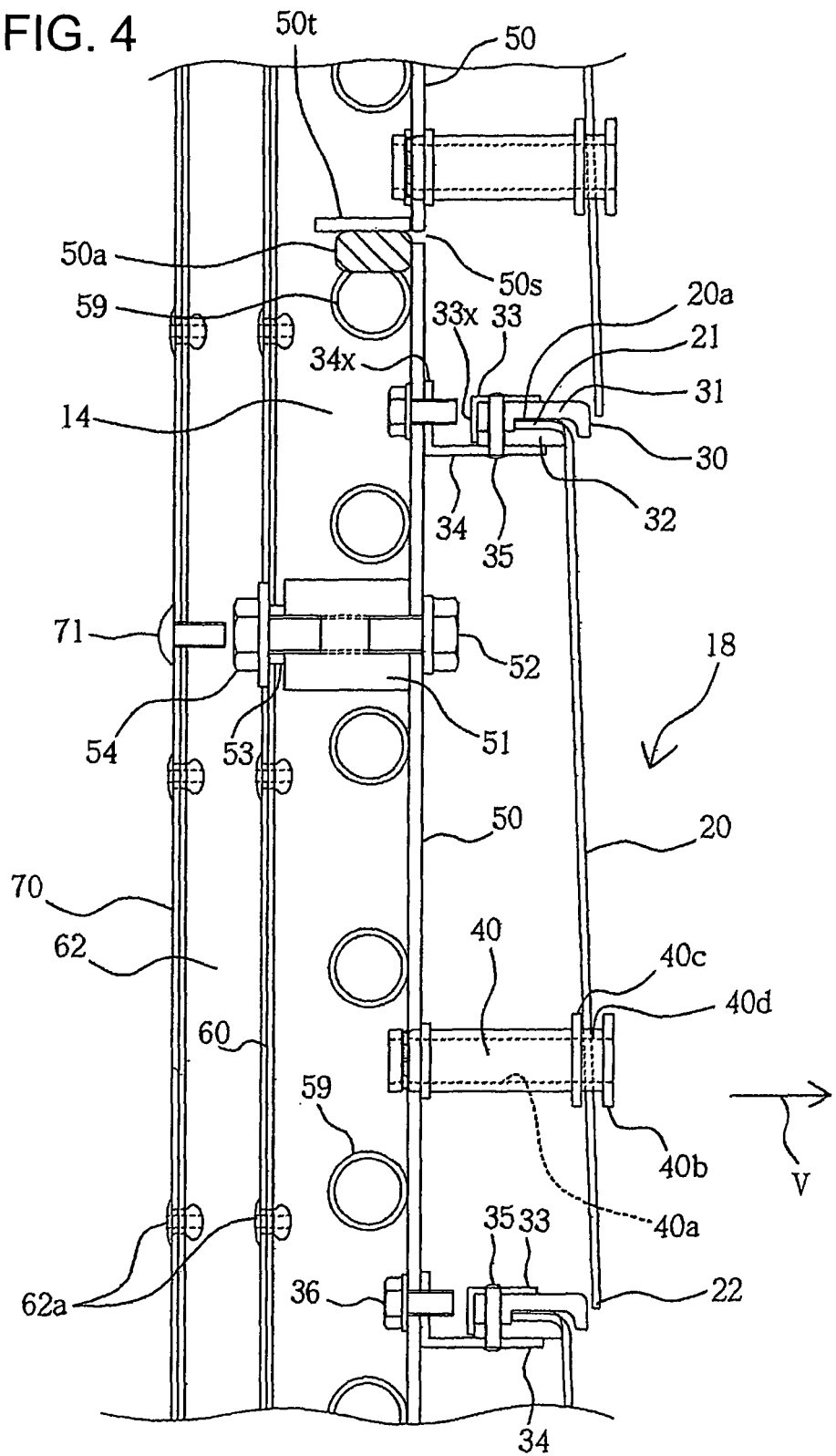
FIG. 4 is an enlarged view of the region A in FIG. 2.
Figure 5:
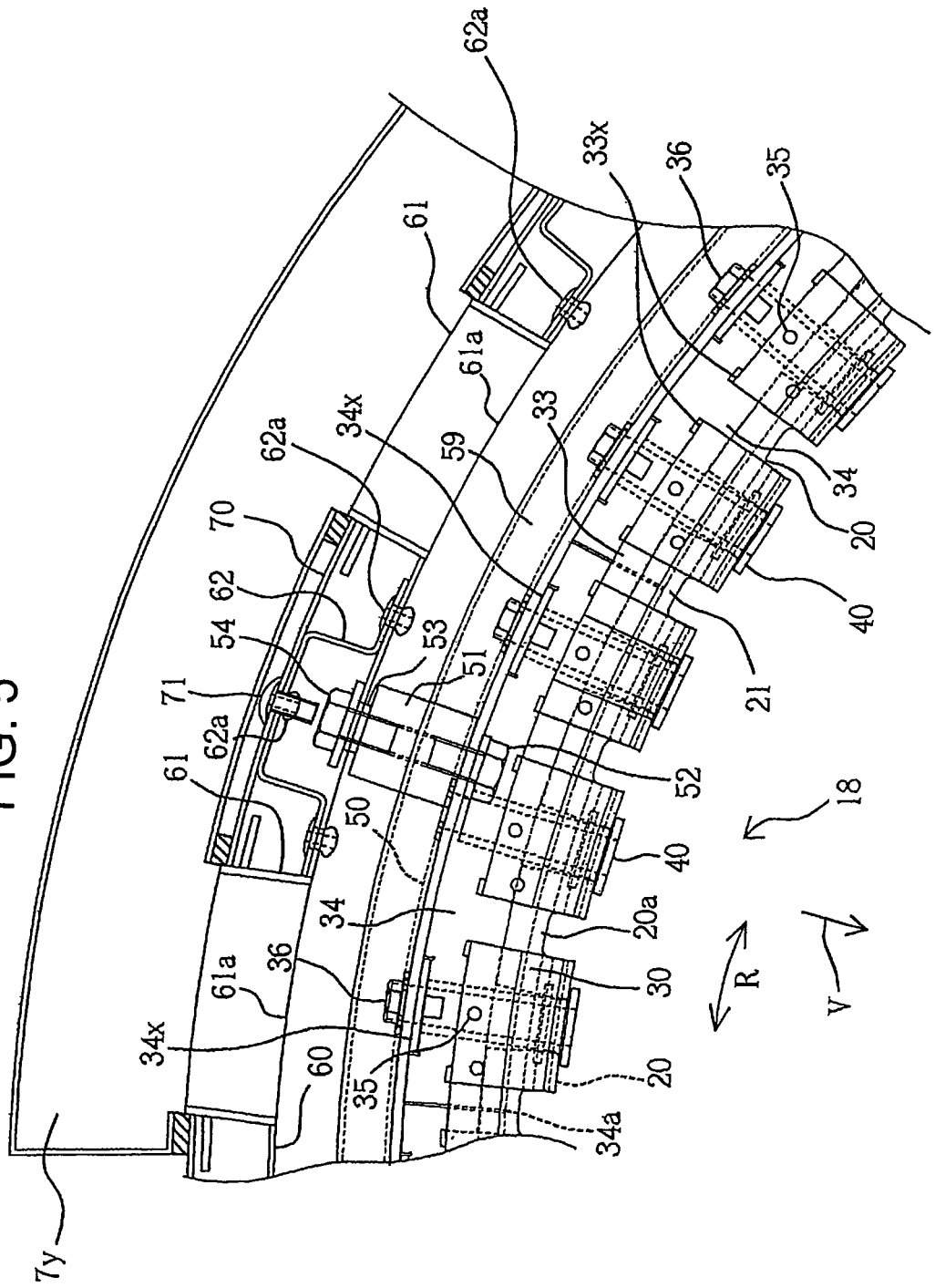
FIG. 5 is an enlarged view of the region B in FIG. 3.
Figure 6:
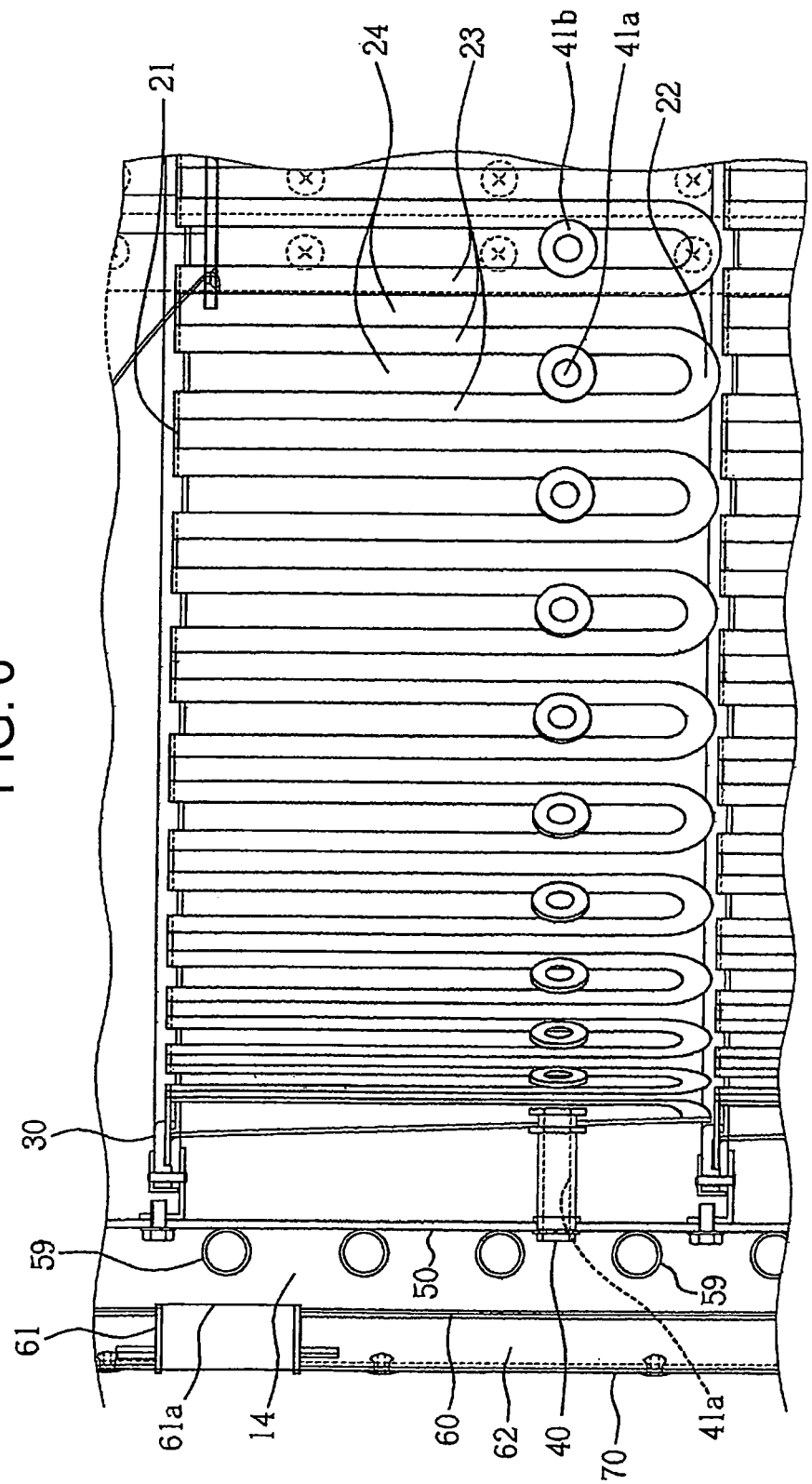
FIG. 6 is an enlarged view of the region C in FIG. 2.

FIG. 4 is an enlarged view showing the section A in FIG. 2. The heating elements (heater wires) 20 are fixedly mounted to the inner shell 50 by hanging insulators 30 made of an electrically insulating material such as alumina. The heating elements 20 are fabricated as flat heating members from a heating material, such as Fe—Al—Cr alloy, which can heat up quickly and formed in a strip shape in the cross section for increasing the heating area. More particularly, the heating element 20 is arranged in a zigzag shape extending up and down with its turned portions 21, 22 provided at both sides. The two, upper and lower, turned portions 21,22 are displaced from each other by a half pitch as sandwiching element portions 23 and gap portions 24 arranged alternately. The upper turned portions 21 of the heating element 20 are bent inwardly to have bent portions 20a which are then held by their respective hanging insulators 30. The inner side of the inner shell 50 is mirror finished for reflecting and directing the heat emitted from the back side of the element portions 23 of the heating element 20 through the gap portions 24 towards the heating space 18.

The hanging insulator 30 comprises an upper insulator 31 and a lower insulator 32 which both are made of a heat-resistant insulating material such as alumina, sandwiched between an upper fitting 33 and a lower fitting and joined together by a pin 35 in welding manner to the corresponding bent portion 20a of the heating element 20 while holding the same from both, upper and lower, sides. The other end of the lower fitting 34 is bent and joined at two locations by bolts 36 to the inner shell 50.

A number of fast cooling pipes 40 are mounted to the inner shell 50 for feeding the cooling gas through its communicating bore 40a from the gas passage 14 to the inside of the inner shell 50 as projecting inwardly from the inner side of the inner shell 50. The fast cooling pipes 40 are made of a heat-resistant, electrically insulating material such as alumina. The fast cooling pipe 40 is designed for inhibiting the movement at the intermediate of the heating element 20 with its extending-through portion 40d extending through the gap portion 24 of the heating element 20 and its flange portions 40b, 40c of substantially a circular shape which are elongated outwardly at a right angle to the extending direction V along which the fast cooling pipe 40 extends through the heating element 20. More specifically, the extending-through portion 40d of the fast cooling pipe 40 serves as a groove between the two flange portions 40b, 40c. In addition, the heating element 20 is overlapped at the lower end with the upper end of the hanging insulator 30 at the lower level so that its movement along the extending direction of the fast cooling pipe 40 is inhibited.

A water cooling conduit 59 is mounted as a cooling medium running passage on the back side of the inner shell 50. The water cooling conduit 59 is arranged in a spiral form directly on the back or outer side of the inner shell 50, extending axially. As the inner shell 50 is prevented from increasing its temperature by the cooling medium such as cooling water running through water supply and discharge passages 59a, 59b, its temperature can remain substantially at a constant degree.

The outer shell 60 is insulatingly mounted by a set of connecting insulators 51 to the outer side of the inner shell 50. The connecting insulators 51 are made of an alumina material which has both properties of the electrical insulation and the resistance to heat and permit the outer shell 60 to receive no current even if the inner shell 50 accidentally comes into direct contact with the heating elements 20 and becomes short-circuited.

The connecting insulators 51 are fixedly joined at the inner end by first bolts 52 to the inner shell 50. The connecting insulators 51 are fixedly joined at the outer end to the outer shell 60 by second bolts 53 via annular hollow collars 53 made of a heat-resistant insulating material. As each of the collars 53 is set to extend through the mounting hole in the outer shell 60 with its thickness greater than that of the outer shell 60, it produces a clearance (gap) between the head at the lower side of the second bolt 54 and the outer surface of the connecting insulator 51. Accordingly, when the inner shell 50 is expanded by thermal expansion, its expansion can be offset by the clearance thus protecting the outer shell 60 from receiving any thermal stress and generating any deformation.

The decorative panel 70 is mounted as an outermost shell or side wall by pillars 62 to the outer side of the outer shell 60. The pillars 62 are joined at their flanges by, for example, metallic rivets 62a to both the outer shell 60 and the decorative panel 70 while the outer shell 60 has tubular openings 61a provided at the upper end thereof for communication with the gas passage 14. As pipes 61 are mounted to communicate at one end to the openings 61a, they extends through the decorative panel 70 and their other ends are communicated with the cooling gas infeed duct 7y. The pillars 62 and the decorative panel 70 are fabricated from an electrically conductive materials, for example, a metallic material such as stainless steel. The decorative panel 70 and the outer shell 60 are electrically connected to each other by the pillars 62. The substrate processing apparatus itself is protected by the previously described insulating arrangement from short-circuiting to the outer shell 60 and the decorative panel 70 thus to allow no electrical shock during the maintenance action or no breakage of electrical components.

Referring to FIG. 4, the inner shell 50 are separated into segments along the vertical direction. Any two, upper and lower, adjacent segments of the inner shell 50 are separated from each other by a gap 50s. A thermally insulating blanket 50a made of a thermally insulating material such as ceramic fiber is disposed between a first flange 50t provided at the lower end of the upper segment and the water cooling conduit 59 mounted to the lower segment of the inner shell 50, thus inhibiting the escape of heat from the gap 50s and thermally separating the two, upper and lower, segments from each other.

Figure 7:
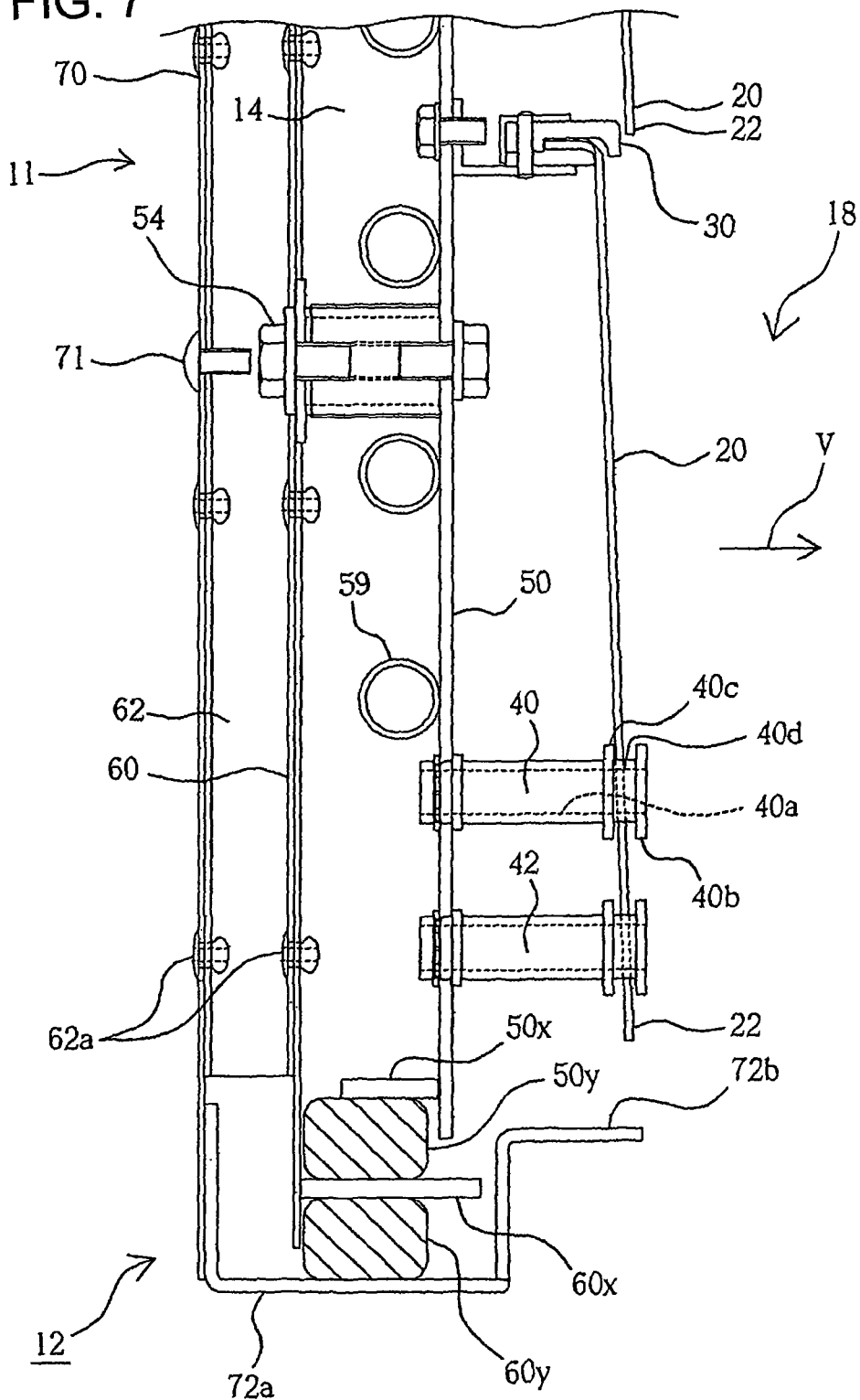
FIG. 7 is an enlarged view of the region D in FIG. 2.
Figure 8:
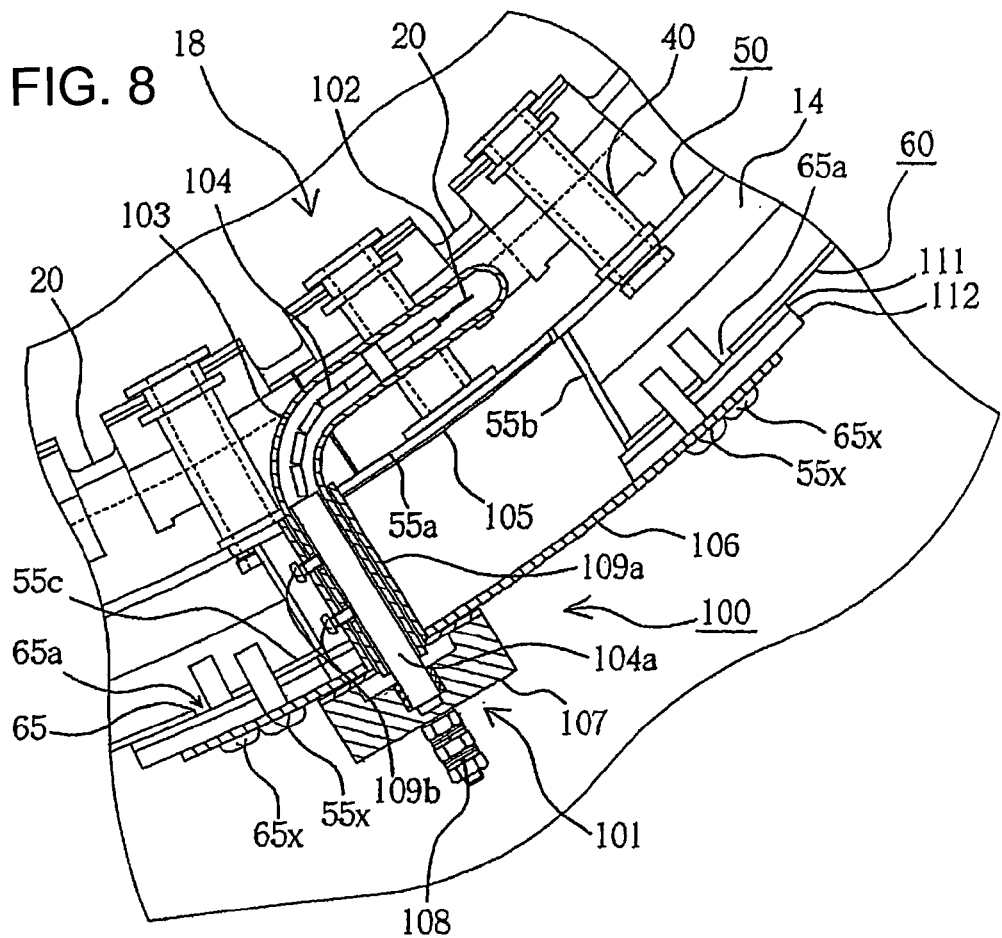
FIG. 8 is a transversely cross sectional view showing the details of a temperature sensor mounting region.
Figure 9:
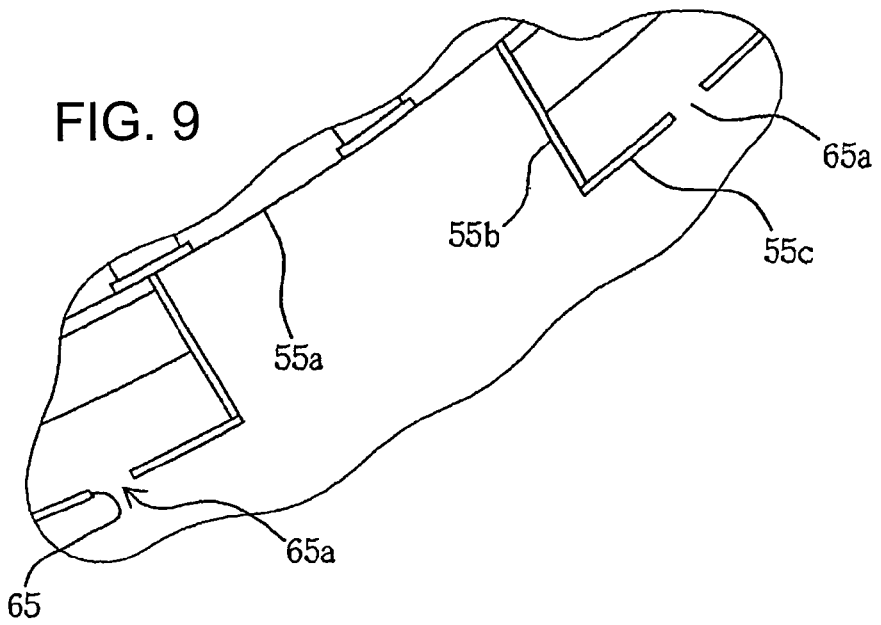
FIG. 9 is a view, similar to FIG. 8, showing the relationship between the inner shell and the outer shell.
Figure 10:
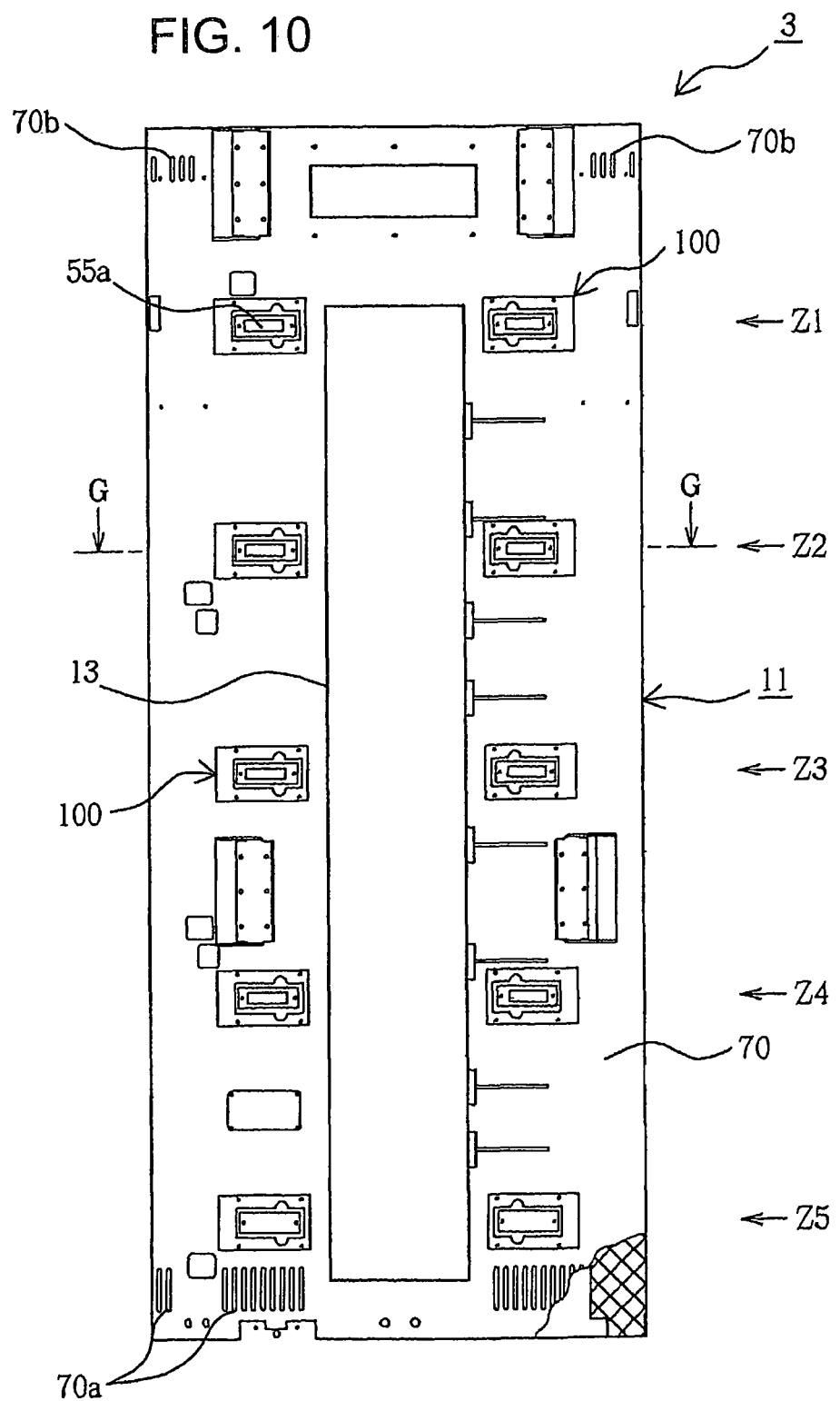
FIG. 10 is a side view of the heating apparatus.
Figure 11:
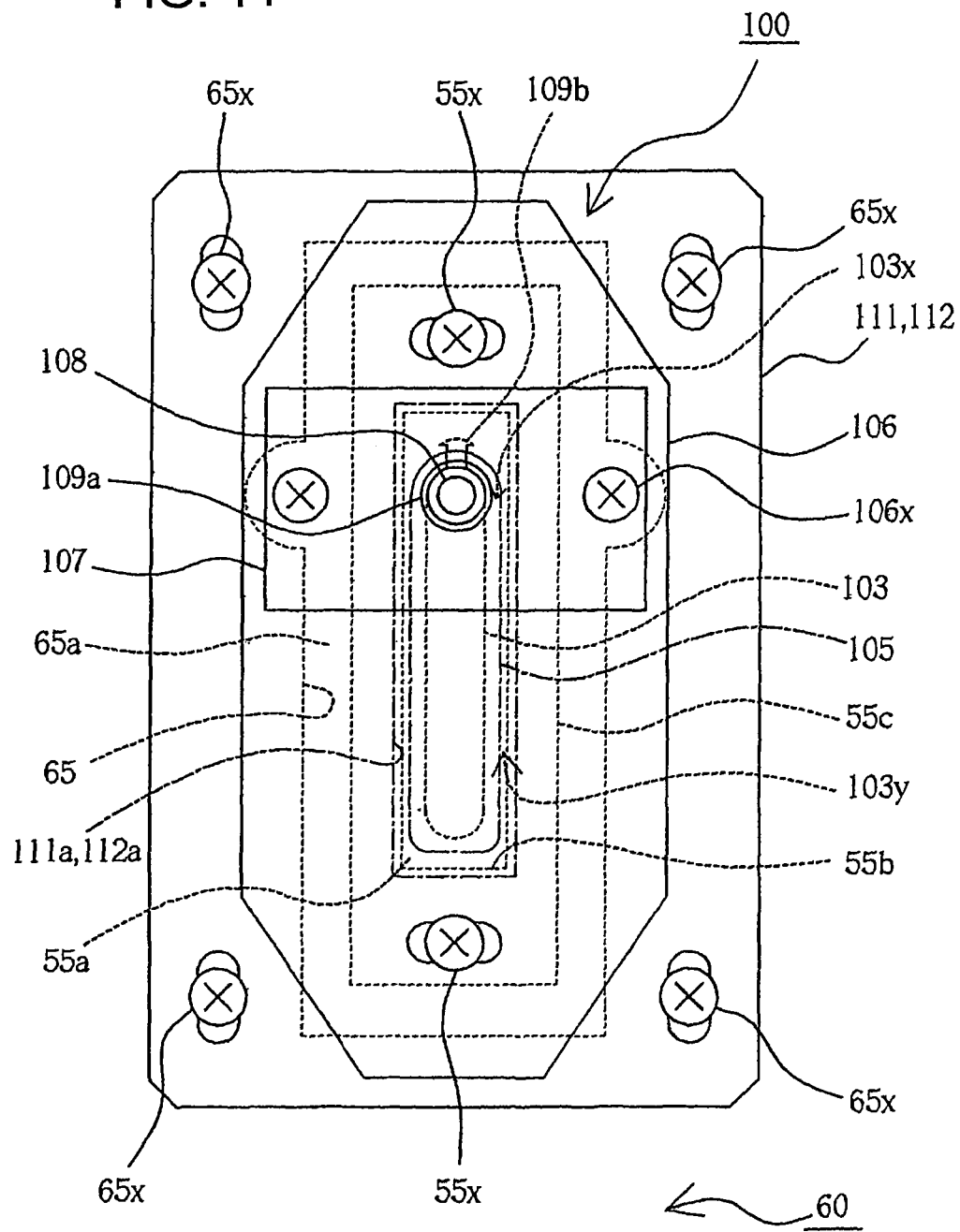
FIG. 11 is a side view of the temperature sensor mounting region.

Referring to FIG. 7, a thermally insulating blanket 50y made of an electrically, thermally insulating material is disposed between a second flange 50x provided outwardly at the lower end of the lowermost segment of the inner shell 50 and a third flange 60x provided inwardly at the lower end of the outer shell 60 at the lowermost end of the intermediate unit 11. This allows the inner shell 50 and the outer shell 60 to be electrically insulated from each other and remain air-tightened by the thermally insulating blanket 50y between them. In addition, a thermally insulating blanket 60y made of a thermally insulating material is disposed between the third flange 60x and a bottom cover 72a for ensuring the air tightness of the internal space in the inner shell 50. The same arrangement is provided between the intermediate unit 11 and the ceiling 10 for ensuring both the electrical insulation and the airtightness. The lowermost heating element 20 at the bottom level is supported by an extra water cooling conduit 42 which is different from the water cooling conduits 40 mounted to the heating element 20 for inhibiting the displacement at the intermediate of the heating element 20.

A mounting structure 100 for a temperature sensor 101 acting as the first temperature detector TC1 will be described referring to FIGS. 8 to 11. The temperature sensor 101 is provided for detecting the temperature at the proximity of the heating elements 20 in order to control the output of the heaters. It is hence necessary for controlling the temperature precisely to accurately measure the temperature of the heating elements 20. Accordingly, the temperature sensor is preferably disposed close to the heating elements 20. As shown locally in FIG. 10, a pair of the temperature sensor mounting structures 100 are provided at both, left and right, sides of the terminal case 13 in each of the zones Z1 to Z5 or alternatively, one temperature sensor mounting structure 100 may be disposed at each zone.

In the temperature sensor 101, a thermocouple contact 102 is installed as the temperature detector at the distal end in a protective conduit 103 made of a transparent insulating material such as quartz or alumina, protected throughout its element with insulator tubes 104, and connected to a terminal 108 fixedly mounted to the insulator 107. The insulator tubes 104 and the insulator 107 are fabricated from an insulating material such as alumina. An inner flange 105 and an outer flange 106 are fixedly mounted to a metal conduit 109a by welding. The inner flange 105 serves as a first opening cover so as to have a gap in the first opening 55a. The outer flange 106 serves as a support for supporting the temperature sensor. The protective conduit 103 is held in the metal conduit 109a. Two retaining screws 109b are screwed into the metal conduit 109a so that they extend through the apertures in the protective conduit 103 and press against the insulator tubes 104a thus to prevent the protective conduit 103 from being turned and secure the protective conduit 103. The insulator 107 is fixedly mounted by screws 106x to the outer flange 106. The protective conduit 103 is belt to an L shape having a bent. The protective conduit 103 is so shaped that the thermocouple contact 102 is distanced from the external portion such as the terminal 108 which is exposed to the outside of the heating apparatus, hence minimizing a drop in the temperature at the distal end of the thermal sensor 101. Also, there is provided a gap 103x between the metal conduit 109a through which the protective conduit 103 extends and the inner side of the box 55b, hence permitting no thermal conduction and minimizing the temperature drop. Additionally provided is another gap 103y between the inner shell 50 at the opening 55a and the inner flange 105 thus to allow no thermal conductive and minimize the temperature drop.

A box 55b is airtightly provided as a partition at the first opening 55a of the inner shell 50. The other side of the box 55b is joined with a flange 55c thus forming an airtight box form. There is a gap 65a provided between the flange 55c and the outer shell 60 at the second opening 65 thus to ensure the electrical insulation between the box 55b and the outer shell 60 or between the inner shell 50 and the outer shell 60. The box 55b and the flange 55c are fabricated from an electrically conductive material, namely a metallic material such as stainless steel.

Two, first and second, packings 111, 112 which are almost identical in the shape are mounted by four screws 65x to the outer shell 60 for shutting up the openings 65. The first packing 111 is made of a material, such as heat-resistant paper, which has degrees of electrical insulation, resistance to heat, and elasticity. The second packing 112 is made of a material, such as poly vinylidene fluoride, which has degrees of electrical insulation and resistance to heat and a degree of rigidity which is at least greater than that of the first packing 111 for pressing uniformly against the elastic, first packing 111.

The temperature sensor 101 is mounted by two screws 55x to the flange 55c. At the time, the two, first and second, packings 111, 112 are further pressed with the outer flange 106 thus to prevent the atmosphere in the gas passage 14 from entering the inner shell 50 through the gap 65a. The metallic, outer flange 106 remains electrically conductive with the inner shell 50 across the screws 55x while being insulated by the two, first and second, packings 111, 112 from the outer shell 60. The inner flange 105 extends across the apertures 111a, 112a of the two, first and second, packings 111, 112 to the interior of the box 55b thus to almost shut up the opening 55a for inhibiting the heat generated by the heating elements 20 from being dissipated to the two, first and second, packings 111, 112 which can thus be prevented from being deteriorated by the effect of the heat. In addition, the gap 103y permits the atmosphere in the heating space 18 to be equal in the temperature to the atmosphere in the box 55b. Accordingly, the temperature sensor 101 will be prevented from being affected by the temperature of the atmosphere in the box 55b and allowed to measure the temperature at higher accuracy.

As described, the temperature sensor 101 is mounted airtightly to the inner shell 50 thus to disallow the cooling gas to flow in from the gas passage 14 and can measure the temperature of the heating elements 20 at higher accuracy. Also, the gap 65a is filled with the electrically insulating material for ensuring the electrical insulation between the inner shell 50 and the outer shell 60. Even if the heating elements 20 are thermally deformed at the proximity of the temperature sensor 101, they will hardly come into contact with the inner flange 105 arranged substantially equal in the overall size to the temperature sensor 101 or the metal conduit 109a but only with the electrically insulating, protective conduit 103, hence ensuring the electrical insulation at the temperature sensor mounting components of the inner flange 105 and the outer flange 106. Moreover, since the inner shell 50 has no thermally insulating material mounted to the inner side thereof, the increase or decrease of the temperature as well as the throughput can be improved with the effect of the gas passage 14 and the fast cooling tube 40.

The action of the substrate processing apparatus 1 will then be described.

The action of processing the wafers 305 starts with loading the boat 300 which carries the wafers 305 into the reactor tube 310 by the movement of the boat elevator and rapidly heating up the same to a desired temperature by the heating action of the heating apparatus 3. When the wafers 305 haven been heated up to the desired temperature by the heating apparatus 3, the reactive gas is introduced from the reactive gas infeed conduit 5x. The action of thermally processing the wafers 305 is performed when the reactive gas has been removed out the reacting gas discharge conduit 6x.

In common, the furnace is kept at a preset temperature, e.g., 550° C., before the boat 300 is loaded in. When the boat 300 has been loaded in, the furnace is heated up to a desired, wafer processing temperature, e.g., 850° C. Both the temperature prior to the loading and the temperature for processing the wafers can selectively be determined depending on the requirements of the processing action in the substrate processing apparatus.

The heating elements 20 at each level are measured at each zone by the temperature monitor 4a and the temperature of the heating action can thus be controlled with the heating elements 20 and the reflector 90. The heating element 20 at each zone is a single element. This allows each of the heating elements 20 to be easily identified when its defect such as disconnection is found. The deterioration of the heating elements at each level can also be detected with ease.

After the completion of the processing action, the furnace is rapidly cooled down to a wafer unloading temperature, e.g., 550° C. The cooling of the wafers 305 after the processing action involves opening the flow controller 5a and the air valve 7a to introduce air or inactive gas such as nitrogen gas from the cooling gas supply conduits 5y and 7. The cooling gas received from the cooling gas supply conduit is introduced from the extending bores 40a of the fast cooling pipes 40 into the heating space 18 where it quickly cool down the heating elements 20 from both, inner and outer, sides.

Using the construction of the cooling pipes 40, the speed for cooling the heater and thus the wafers can be improved thus to enhance the throughput of the wafer processing action. Also, since the cooling pipes 40 serve as the retainers for retaining the heating elements and the cooling gas guiding passages, no separate conduits for feeding the heater cooling gas will be needed while the heating area on the inner wall of the furnace is increased. Moreover, the openings of the extending bores 40a of the cooling pipes 40 are located more inward than the heating elements 20, hence protecting the heating elements 20 from being cooled down locally by the cooling gas. Accordingly, the heating elements 20 is prevented from local deflection, twisting, and fracture and can thus suffer from no disconnection or no direct contact with the reactor tube 310.

The cooling gas to be introduced into the tubular gas passage 14 is dispersed from the cooling gas infeed duct 7y which is large in the volumetric size and can thus enter the gas passage 14 uniformly while its biasing flow is controlled. When having been conveyed through the conduits 61, the gas passage 14, and the fast cooling pipes 40 into the heating space 18, the cooling gas runs upwardly from the heating space 18 and is finally discharged from the discharge conduit 81. The inner side of the inner shell 50 is cooled down by the cooling gas running upwardly through the heating space 18 while the thermal equalizer tube 315 and the reactor tube 310 are cooled down by the cooling gas running upwardly through the heating space 18 and the thermal equalizer internal space 317. As the result, the wafers 305 in the reactor tube 310 can quickly be cooled down. The heating elements 20 made of Fe—Cr—Al, carbon, or SiC enables rapid heating up to a higher temperature while the rapid cooling down of the heating module 3 by the cooling gas is carried out.

When the cooling action has been completed, the boat elevator lifts down the boat 300 and the processed wafers 305 are unloaded from the boat 300. In case that the de-pressurizing action is involved, the boat 300 is lifted down after the pressure in the reactor chamber returns back to an atmosphere level.

Second to sixth embodiments of the present invention will now be described referring to FIGS. 12 to 16. Like components are denoted by like numerals as those of the first embodiment.

Figure 12:
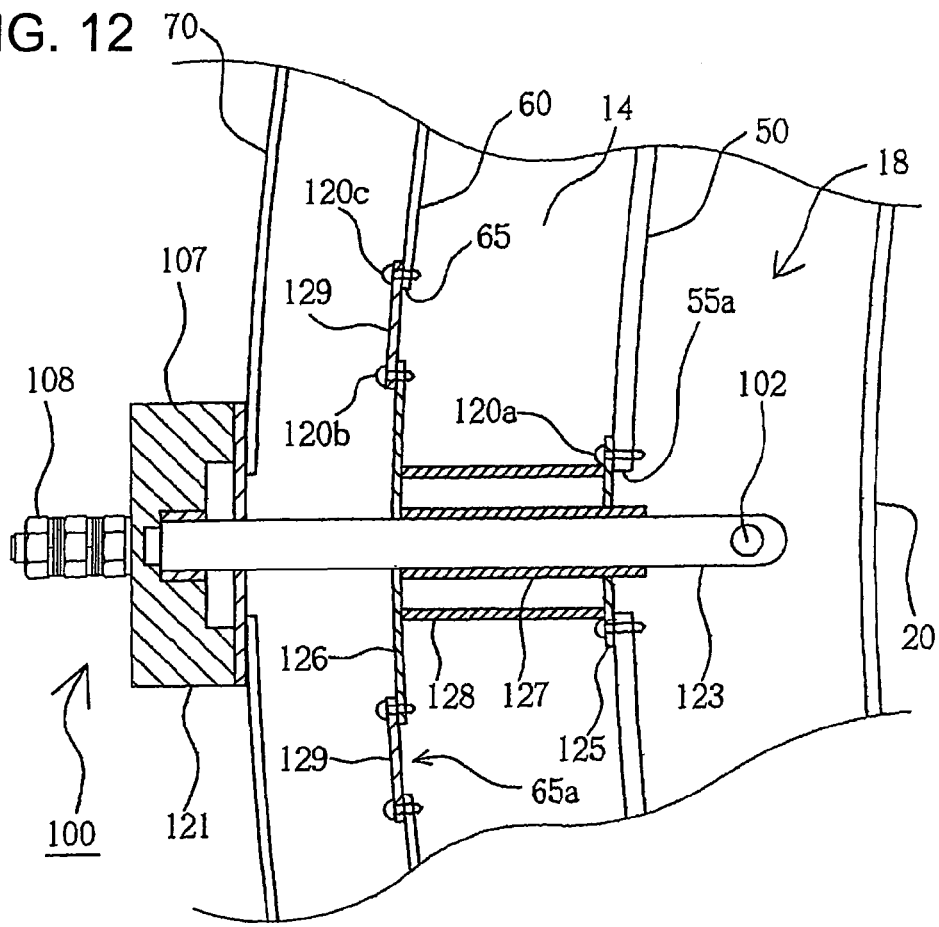
FIG. 12 is a view, similar to FIG. 8, showing another example of the temperature sensor mounting region.

According to the second embodiment shown in FIG. 12, each of temperature sensors 121 in the temperature sensor mounting structure 100 is arranged so that an opening 65 between its outer flange 126 and the outer shell 60 which is greater in the size than the outer flange 126 thus to create a gap 65a is shut up with a packing 129 tightened with screws 120b, 120c. The packing 129 may be fabricated from a thermally resistant material, such as poly vinylidene fluoride, which has degrees of flexibility and electrical insulation. An inner box 127 and an outer box 128 are provided in air-tightness between the inner flange 125 and the outer flange 126 mounted at the opening 55a to the inner shell 50, thus preventing the cooling gas from flowing from the gas passage 14 into the inner shell 50.

The above structure with the packing 129 arranged flexible can offset the deformation of the inner shell 50 caused by thermal expansion. Also, since the clearance is developed between the inner box 127 and the outer box 128, its prevents the temperature sensor 101 from being cooled down without intention by the cooling gas. It is however unfavorable to screw or unscrew the screws 120a for fixedly mounting the inner flange 125 to the inner shell 50. Also, the screwing or unscrewing action of the screws 120a results in the expansion of the inner flange 125 and may thus increase the interval between the cooling conduits 59 and interrupt the fast cooling action. Accordingly, the first embodiment is better than the second embodiment.

Figure 13:
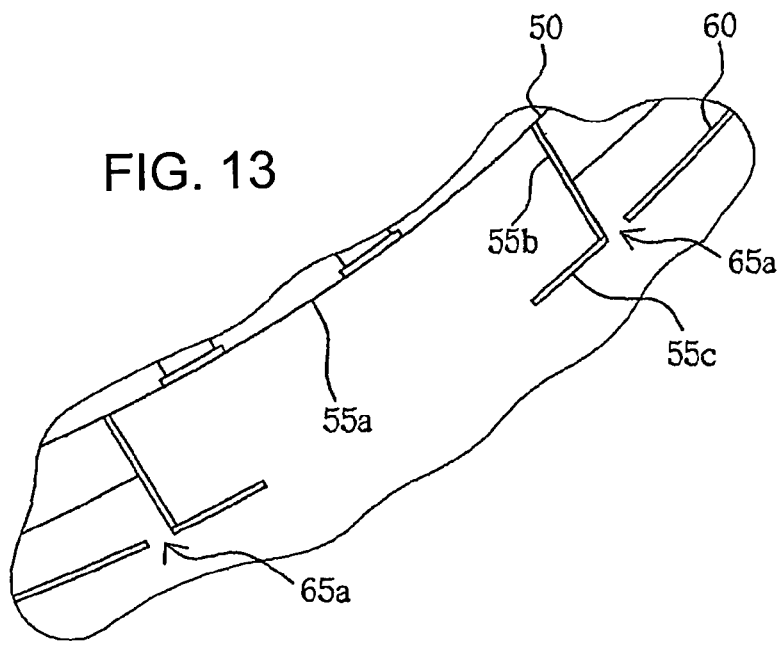
FIG. 13 is a view, similar to FIG. 9, showing the another example of the temperature sensor mounting region.

The third embodiment shown in FIG. 13 is differentiated from the first embodiment by the fact that the flange 55c of the box 55b is disposed inwardly. The third embodiment can substantially provide the same advantages as those of the first embodiment. Because the opening 55a in the inner shell 50 becomes greater in the size with the use of the temperature sensor 101 of the same size, the third embodiment is inferior to the first embodiment.

Figure 14:
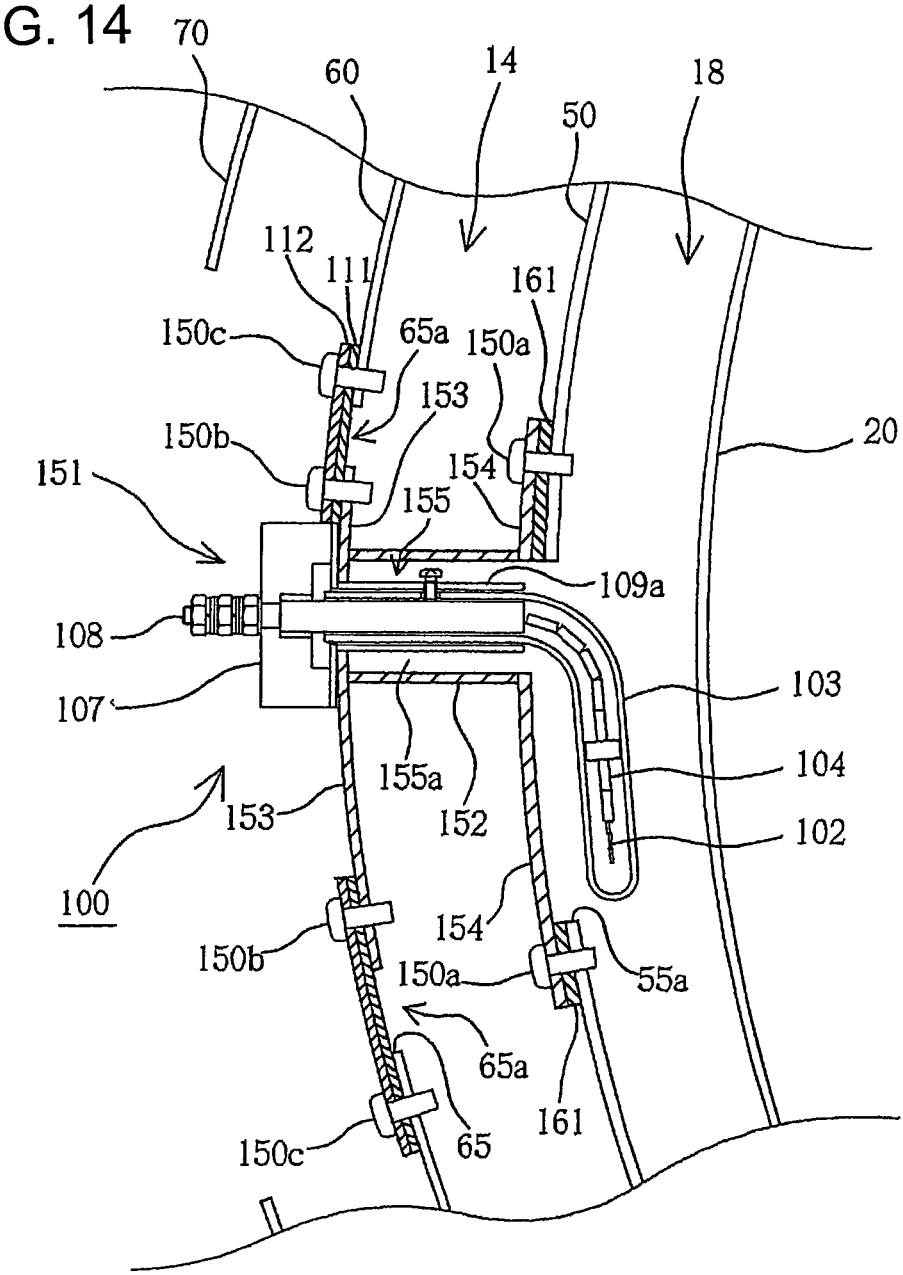
FIG. 14 is a view, similar to FIG. 8, showing a further example of the temperature sensor mounting region.

According to the fourth embodiment shown in FIG. 14, unlike the second embodiment, each of temperature sensors 151 as the temperature detector in the temperature sensor mounting structure 100 has an inner flange 154 provided on the other side of the box 152 while permits the space 155 in the box 152 to communicate with the heating space 18. In the first embodiment described previously, the space in the box 55b is provided just at the outside of the heat contact 102 of the temperature sensor 151 as arranged to be equal in the atmosphere to the heating space 18 for minimizing the cooling down of the air passage 14 with the cooling gas. Accordingly for measurement of the temperature at higher accuracy, the first embodiment is more favorable than this embodiment. However, this embodiment unlike the second embodiment allows the space 155 and the heating space 18 to stay equal in the atmosphere so as to prevent the heat from being leaked out to the outside of the temperature sensor 151 and thus inhibit the temperature to be measured from dropping down and hence, is more favorable than the second embodiment. Also, the space 155 includes a gap 155a between the metallic conduit 109a and the box 152. The gap 155a disallows any depriving of the heat or declination in the temperature by the cooling gas which runs through the gas passage 14. Accordingly, the temperature of the heating elements 20 can be measured at more accuracy. This advantage will equally be given in the fifth and sixth embodiments described below.

The temperature sensor 151 in the fourth embodiment is equipped with the inner flange 154 which is sized to shut up the first opening 55a and fixedly mounted via a packing 161, which is made of such as heat resistance paper, to the inner shell 50 by screws 150a. This significantly prevents the cooling gas from flowing from the gas passage 14 into the heating space 18 and minimizes a difference between the heating elements 20. This embodiment is however susceptible to thermal deterioration by the heat emitted from the heating elements 29. Accordingly, the first embodiment is more favorable than the fourth embodiment for minimizing the effect of the heat on the packings 111, 112. Also, there is a gap 65a provided between the outer flange 153 and the outer shell 60 at the second opening 65 and shut up with the two, first and second, packings 111, 112 for ensuring the electrical insulation and the air-tightness.

It is necessary to place the flange 55c of the box 55b, the outer flange 106 of the temperature sensor 101, and the outer shell 60 on the same plane. However, there are common manufacturing tolerances between the box 55b, the flange 55c, the outer flange 106, and the outer shell 60 while both the inner shell 50 and the outer shell 60 are arranged of tubular shapes which are curved along the circumferential direction and positioned concentrically. The box 55b is joined by welding to the inner shell 50. Under those conditions, the placement on the same plane of the flange 55c, the outer flange 106, and the outer shell 60 is not so easy. Therefore, the gap 65a is shut up with two discrete insulating materials which are different in the rigidity and held down by the outer flange 106.

In addition, it is necessary for ensuring the air-tightness at the gap 65a to place the three components on the same circumferential surface. In this embodiment, a box 152 is mounted to the outer flange 153 of the temperature sensor 151. Since the outer flange 153 acts as a box flange, the outer flange 153 and the outer shell 60 only can be positioned for the successful placement. Also, as the inner flange 154 of the box 152 is joined by the screws 150a to the inner shell 50, their positioning can be carried out with much ease. Accordingly, the positioning of the outer flange 153 and the outer shell 60 becomes simple, thus facilitating the assembling of the heating elements and ensuring the air-tightness at the gap 65a.

In the first embodiment, the box 55b is mounted to the inner shell 50 while the flange 55c of the box 55b and the outer flange 106 of the temperature sensor 101 are fixedly mounted to the outer shell 60. It is hence necessary for holding the distance between the temperature sensor 101 and the heating elements 20 uniform to position the box 55b, the flange 55c, and the outer flange 106 of the temperature sensor 101. However, the positioning of those components is not so easy while the gap 65a is shut up with the two different insulating materials.

On the other hand, this embodiment allows the box 152 to be joined to the outer flange 153 of the temperature sensor 151 which thus acts as a flange for the box 152 so that the positioning of the outer flange 153 and the outer shell 60 only is mandatory. Accordingly, as the outer flange 153 and the outer shell 60 are positioned with ease, the distance between the temperature sensor 101 and the heating elements 20 can be held uniform without difficulty.

Also in the first embodiment, the screws 55x are tightened for pressing the outer flange 106 against the insulating material thus to ensure the air-tightness at the gap 65a. The screws 55x may hence be unscrewed and removed with much difficulty due to the deformation by thermal expansion at high temperatures. This embodiment permits the positioning of the outer flange 153 and the outer shell 60 to be carried out easily. It is hence unnecessary for ensuring the air-tightness at the gap 65a to strictly tighten the screws 150b, 150c. The screws 150b, 150c can be tightened at a moderate torque for ensuring the air-tightness at the gap 55a. It is also not difficult to unscrew and remove the screws. The screws 55x in the first embodiment are located between the outer shell 60 and the gas passage 14 thus to minimize the above drawback.

In this embodiment, the screws 150a are used for fixedly joining the inner flange 154 to the inner shell 50 and may thus be unscrewed and removed with some difficulty. The screws 150a may also be lost in the interior during the removing action. The screwing of the screws 150a likely expands the inner flange 154 and thus increases the interval between the cooling conduits 59, interrupting the fast cooling action. Accordingly, the first embodiment is more favorable than this embodiment in this respect.

Figure 15:
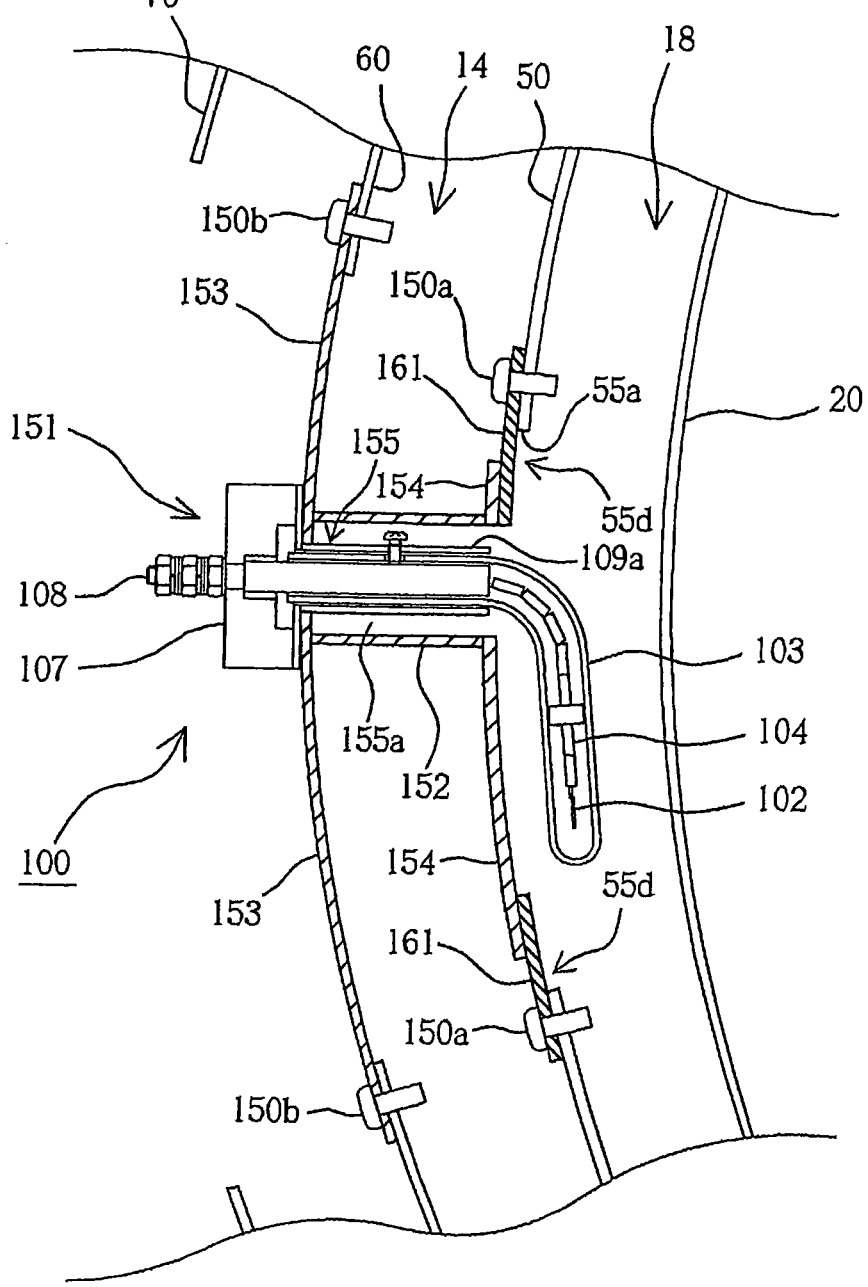
FIG. 15 is a view, similar to FIG. 8, showing a still further example of the temperature sensor mounting region.

In the fifth embodiment shown in FIG. 15, a gap 55d is provided at the first opening 55a between the inner flange 154 and the inner shell 50. The inner shell 50 is accompanied with a packing 161 made of an electrically insulating material such as heat-resistant paper and tightened with the screws 150a. As the outer flange 153 is fixedly mounted to the outer shell 60, the inner flange 154 presses against the packing 161 thus to shut up the gap 55d. The gap 55d produces the electrical insulation at the proximity of the heating elements 20 between the inner shell 50 and the outer shell 60. Even if the heating elements 20 are thermally deformed due to the structure, they may come into direct contact with the protective conduit 103 made of the electrically insulating material but not the inner flange 154 or the metallic conduit 109a which are fabricated from the conductive materials. Accordingly, no electrical conduction between the inner shell 50 and the inner flange 154 will be permitted. Even if the heating elements 20 come into direct contact with the inner shell 50, no current will flow out from the outer flange 153 to the outer shell 60, the decorative panel 70, or any other section of the substrate processing apparatus. Since the gap 55d ensures the electrical insulation, the outer flange 153 sized enough to shut up the second opening 65a and cover the inner flange 154 can be joined directly to the outer shell 60 by the screws.

Similarly in this embodiment, the screws 150a are used for fixedly joining the packing 161 to the inner shell 50 and may thus be unscrewed and removed with some difficulty. Also, the mounting and dismounting of the packing 161 with which the gap 5d is shut up requires the removal of the temperature sensor 151 which is troublesome. The first embodiment allows the insulating material to be easily mounted or dismounted for shutting up the gap 65a from the outside of the outer shell 60. Accordingly, the first embodiment is more favorable than this embodiment in this respect. In addition, the first embodiment is more protected from the deterioration of the packing 161 by the heat of the heating elements 20 and the development of a gap between the inner flange 154 and the packing 161 due to the thermal expansion of the inner shell 50 or the outer shell 60 as well as the deterioration of the packing 161.

Figure 16:
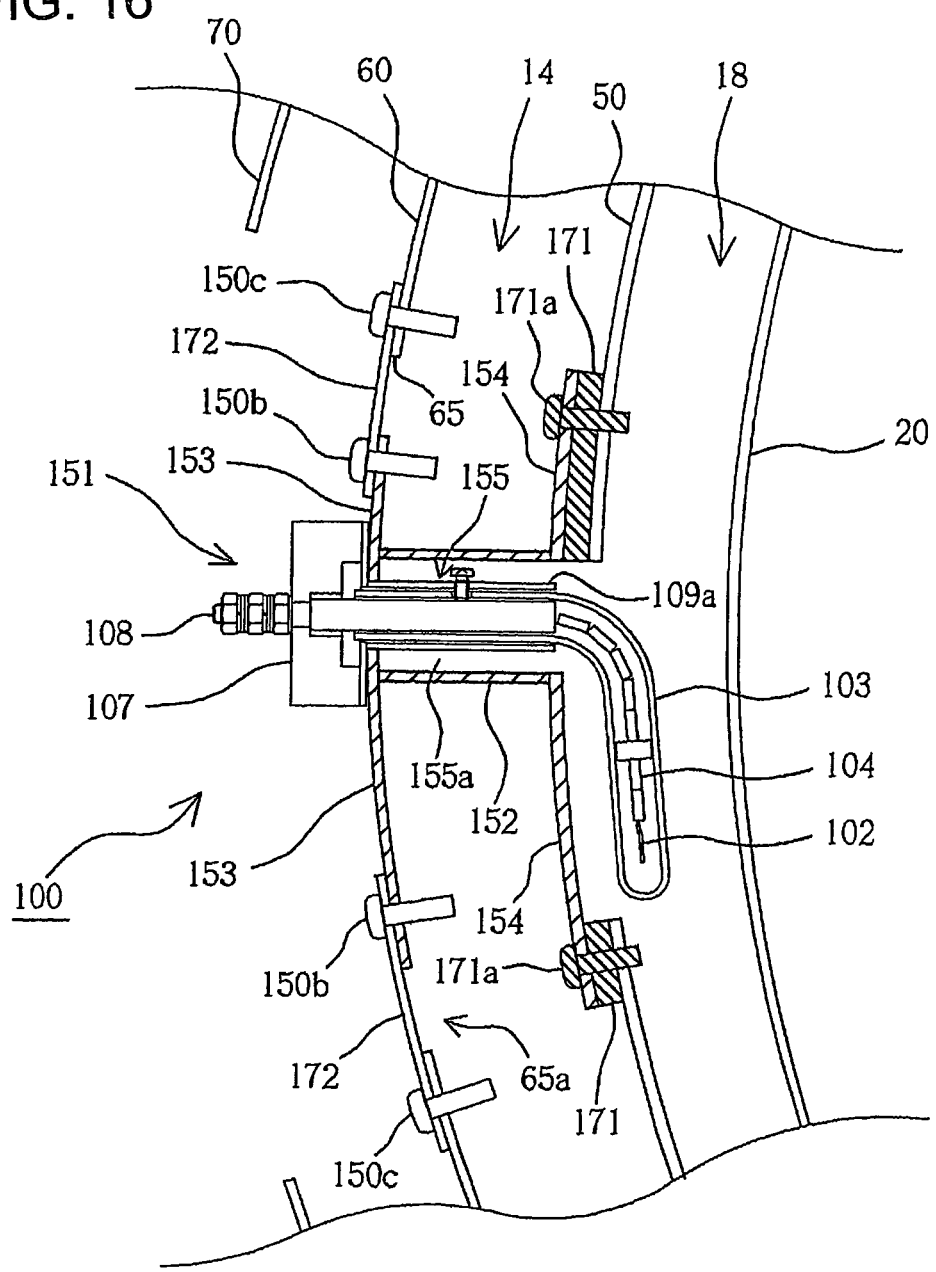
FIG. 16 is a view, similar to FIG. 8, showing a still further example of the temperature sensor mounting region.

In the sixth embodiment shown in FIG. 16, the inner flange 154 is mounted via an electrically insulating material 171, such as Teflon (registered trademark), to the inner shell 50 by screws 171a which are made of an electrically insulating material. The inner flange 154 and the inner shell 50 are thus insulated from each other by the insulating materials 171 and 171a. The thickness of the insulating material 171 may be determined for ensuring the electrical insulation, depending on the supply voltage. For example, when the supply voltage is 200 V, the thickness is preferably set to about 5 mm. This arrangement like that of the fifth embodiment allows the inner shell 50 and the temperature sensor 151 to be electrically insulated from each other at the proximity of the heating elements 20.

Also, as the inner flange 154 and the inner shell 50 are electrically insulated from each other, a cover 172 made of an inexpensive metallic material is used for fixedly joining the outer flange 154, which is smaller in the inner diameter than the second opening 65 at the inner flange 154, to the outer shell 60 for mounting the temperature sensor 151. Alternatively, the cover 172 may be made of an electrically insulating material for further improving the electrical insulation. In the latter case, the gap 65a between the outer flange 153 and the outer shell 60 is shut up with the cover 172 of the electrically insulating material for ensuring the electrical insulation between the outer flange 153 and the outer shell 60. In this embodiment, the screwing and unscrewing of the screws 171a is not so easy. It is also necessary for mounting and dismounting the insulating material 171 to temporarily remove the temperature sensor 151. This will be troublesome. Accordingly, the first embodiment is more favorable in this respect. Except the above drawback, the fourth and fifth embodiments can provide the same advantages as of the first embodiment.

Figure 17:
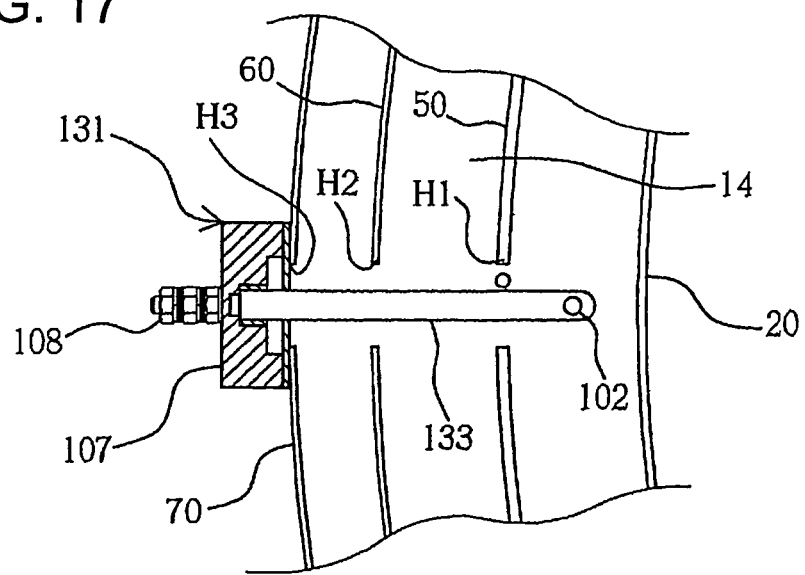
FIG. 17 is a view, similar to FIG. 8, showing a first comparative example of the temperature sensor.

Comparative examples to the embodiments will now be described referring to FIGS. 17 and 18. In the first comparison shown in FIG. 17, the contact 102 of the temperature sensor 131 has to be located close to the heating elements 20. For the purpose, there are through holes H1, H2, and H3 provided in the inner shell 50, the outer shell 60, and the decorative panel 70 respectively across which the protective tube 133 made of alumina extends. This arrangement however permits the cooled atmosphere in the gas passage 14 to pass through the through holes H1, H2, and H3 and flow into the inside of the inner shell 50. As the result, the temperature measured at the contact 102 is declined and its measurement will be less accurate. Particularly with the fast cooling blower remaining turned on, the temperature of the heating elements may hardly be measured because of increase of the cooling gas. The measurement of the temperature will thus be found close to the room temperature as being far from the actual degree. The activation of the exhaust blower for conducting the fast cooling action involves not only the fast cooling action at a predetermined ramp-down rate but also the temperature controlling action.

Figure 18:
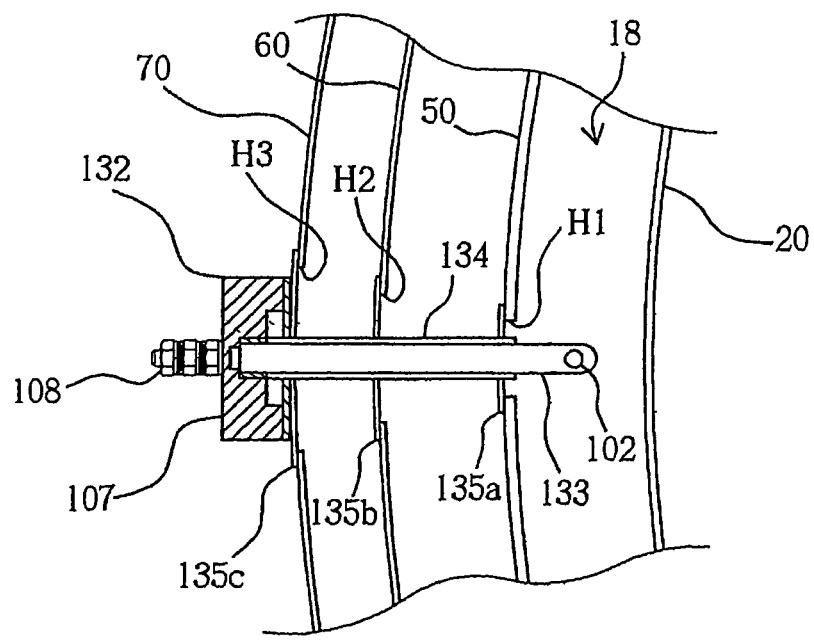
FIG. 18 is a view, similar to FIG. 8, showing a second comparative example of the temperature sensor.

The second comparison shown in FIG. 18 allows the through holes H1, H2, and H3 to be shut up with a flange provided on the temperature sensor 132. The protective tube 133 is covered with another metallic tube 134 to which three flanges 1335a, 135b, 135c are welded. The three through holes H1, H2, H3 are thus shut up with their respective flanges 135a, 135b, 135c. This however causes the inner shell 50, the outer shell 60, and the decorative panel 70 to remain not electrically insulated from each other. The inner shell 50, the outer shell 60, and the decorative panel 70 will unfavorably be conducted in case that the heating elements 20 are electrically connected to the inner shell 50. Also in this comparison, both the inner shell 50 and the outer shell 60 will be varied in the diameter by the effect of thermal expansion thus creating gaps at the through holes H1, H2 between the flanges 135a and 135b. Accordingly, the measurement of the temperature with the temperature sensor 132 will be declined. In addition, since the inner shell 50, the outer shell 60, and the decorative panel 70 have manufacturing tolerances, the action of air-tightly shutting up the openings in the inner shell 50 and the outer shell 60 will face much difficulty. The first to third embodiments are however characterized for eliminating those drawbacks.

In the foregoing comparative examples, the protective tube 133 extends linearly thus to allow the escape of the heat from the heater unit even when the distance between the terminal 108 and the contact 102 is short, hence declining the temperature to be measured and interrupting the measurement of the temperature at accuracy. Accordingly, the protective tube 103 in the first embodiment may be preferred as bent to a L shape although the straight type of the protective tube is equally applicable.

The present invention described in this specification is also implemented in the form of the following embodiments.

1) A substrate processing apparatus having a gap 103x provided between a partition in the form of a box 55b and a temperature detector.

2) A method of manufacturing semiconductor devices with the use of the above substrate processing apparatus, comprising the step of controlling the heating apparatus 3 with a heating controller in response to a measurement of the temperature produced by the temperature detector for processing the substrate while the cooling medium is supplied for running through the cooling medium passage 14.

3) A heating apparatus for use in a substrate processing apparatus for processing a substrate, comprising heating elements, an inner shell for supporting the heating elements, an outer shell disposed along the outer boundary of the inner shell, a cooling medium passage for passing a cooling medium between the inner shell and the outer shell, and temperature detectors for detecting the temperature of the heating elements, wherein the inner shell has a first opening 55a provided therein while the outer shell has a second opening 65 provided therein, a partition wall 55b is provided to extend from the first opening to the proximity of the second opening for separating the temperature detector 101 from the cooling medium passage, and a gap 65a is provided between the partition and the second opening for electrical insulation and shut up with electrically insulating materials 111, 112.

4) A heating apparatus, substrate processing apparatus, and holding structure for heating elements, comprising a tubular side wall, and heating elements arranged of a sheet form having a number of gaps, wherein the side wall is arranged with its inner side finished for reflecting heat and the heating elements are disposed along the inner side of the tubular side wall so that while the heat emitted from the front side of the element portion of the heating elements radiates towards the heating space, the heat emitted from the backside of the element portion is reflected by the inner side of the tubular side wall and passed through the gaps of the heating elements to radiate towards the heating space. In this structure, the width of the gap 24 is sufficiently greater than the width of the element portion 23 of the heating element for effectively utilizing rays of the heat reflected from the inner side of the tubular side wall. Since the gaps are arranged to extend along the axial direction of the tubular side wall and the heating elements are supported at the upper end along the axial direction by holding members, the reflected heat can be utilized at optimum efficiency while the heating elements are improved in the surface density, thus minimizing the amount of the heating elements and increasing the thermal response. Also, as the inner side of the tubular side wall is arranged of a concave shape, its reflection of the heat passing through the gaps and radiating towards the heating space can be concentrated at higher effectiveness. The concave inner side may preferably have an arcuate surface.

It is understood that the present invention is not limited to the described embodiments but may be modified without departing from the scope of the present invention.

Although the reactor container is equipped with the thermal equalizer tube and the reactor tube in the description, it may include only the reactor tube but not the thermal equalizer tube. Alternatively, the number of the tubes is not limited to two but may be one or three with equal success.

The thermal processing action may be applied to not only the oxidation or the diffusion but also the reflow action, the annealing action, or the layer forming action for planarization or activation of the carriers after the ion implantation. The substrate is not limited to a wafer but may be any other relevant planer object such as a photo mask, a printed circuit board, a liquid crystal panel, an optical disk, or a magnetic disk. The present invention is also applicable to not only a batch-type heat processing apparatus or a layer-type heat processing apparatus but also a semiconductor manufacturing system equipped with a heater unit. The inner side of the inner shell 50 or the reflecting member 91 may be mirror finished by not only stainless polishing but also plating with gold, platinum, or any other noble metal.

The decorative panel 70 may be eliminated. It is hence modified, for example, in the second embodiment that the inner side of the insulator 107 is arranged flush with the outer side of the outer flange 126.

The present invention is described in the form of the preferred embodiments and may equally be implemented by comprehensively the following embodiments.

A first example of the heating apparatus according to the present invention is provided comprising: a heating element; an inner shell for supporting the heating element; an outer shell disposed along the outer boundary of the inner shell; a cooling medium passage for conveying a cooling medium between the inner shell and the outer shell; a first opening provided in the inner shell; a second opening provided in the outer shell; a partition arranged to extend from the first opening to the second opening for developing at least a space separated from the cooling medium passage and between the inner shell and the outer shell; and a insulator for shutting up a gap provided between the partition and the second opening.

A second example of the heating apparatus according to the present invention is provided comprising: a heating element; an inner shell for supporting the heating element; an outer shell disposed along the outer boundary of the inner shell; a cooling medium passage for conveying a cooling medium between the inner shell and the outer shell; a first opening provided in the inner shell; a second opening provided in the outer shell; a partition arranged to extend from the first opening to the second opening or from the second opening to the first opening for developing at least a space separated from the cooling medium passage and between the inner shell and the outer shell; and a insulator for shutting up a gap provided between the partition and the second opening or between the partition and the first opening.

Both the first and second examples of the heating apparatus can ensure the electrical insulation between the inner shell and the outer shell while certainly giving the air-tightness in the cooling medium passage. Also, the gap provided between the second opening and the partition allows the insulator to be easily mounted or dismounted therethrough from the outside of the outer shell.

The first and second examples may be modified in which at least a part of a temperature detector is disposed in the space for detecting the temperature of the heating element. They may further be modified in which the partition and the temperature detector are spaced by a gap from each other. Accordingly, the temperature decrease due to dissipation of the heat through the gas passage will be minimized thus permitting the temperature measurement on the heating elements at higher accuracy. Also, they may preferably be modified in which the insulator is implemented by two or more electrically insulating materials which are different in the rigidity and disposed in layers. Accordingly, the insulator can uniformly be fitted to the gap thus improving the air-tightness in the cooling medium passage. The first example may preferably be modified in which the insulator is implemented by two or more electrically insulating materials which are different in the rigidity and disposed in layers and at least one of the electrically insulating materials located at the partition side is higher in the flexibility than the other electrically insulating materials. Both the first and second examples may further be modified in which the second opening is arranged greater in the opening size than the first opening. This facilitates the assembling step. In addition, the escape of the heat from the heating space which significantly affects on the wafer processing action will be minimized. The first example may preferably be modified by further comprising a first opening shutting member is disposed for providing a gap at the first opening. This example may further be modified by comprising a temperature detector for detecting the temperature of the heating element, and a support for supporting the temperature detector, wherein the insulator is disposed between the second opening and the support.

A first example of the substrate processing apparatus according to the present invention is provided having a heating space provided in the heating apparatus of the first or second example and particularly, comprising a reactor container disposed in the heating space for processing a substrate. Another example of the substrate processing apparatus according to the present invention is provided having a heating space provided in the heating apparatus where at least a part of the temperature detector is disposed in the space for detecting the temperature of the heating elements and particularly, comprising a reactor container disposed in the heating space for processing a substrate.

A first example of the method of manufacturing semiconductor devices according to the present invention is provided comprising: loading a substrate into a reactor container; and heating up the inside of the reactor container in a heating apparatus which comprises a heating element, an inner shell for supporting the heating element, an outer shell disposed along the outer boundary of the inner shell, a cooling medium passage for conveying a cooling medium between the inner shell and the outer shell, a first opening provided in the inner shell, a second opening provided in the outer shell, a partition arranged to extend from the first opening to the second opening for developing at least a space separated from the cooling medium passage and between the inner shell and the outer shell, and a insulator for shutting up a gap provided between the partition and the second opening, in order to process the substrate.

A second example of the method of manufacturing semiconductor devices according to the present invention is provided comprising: loading a substrate into a reactor container; and heating up the inside of the reactor container in a heating apparatus which comprises a heating element, an inner shell for supporting the heating element, an outer shell disposed along the outer boundary of the inner shell, a cooling medium passage for conveying a cooling medium between the inner shell and the outer shell, a first opening provided in the inner shell, a second opening provided in the outer shell, a partition arranged to extend from the first opening to the second opening or from the second opening to the first opening for developing at least a space separated from the cooling medium passage and between the inner shell and the outer shell, a insulator for shutting up a gap provided between the partition and the second opening or between the partition and the first opening, in order to process the substrate.

A first example of the insulator according to the present invention is provided for use in a heating apparatus which includes at least a heating element, an inner shell for supporting the heating element, an outer shell disposed along the outer boundary of the inner shell, a cooling medium passage for conveying a cooling medium between the inner shell and the outer shell, a first opening provided in the inner shell, a second opening provided in the outer shell, and a partition-arranged to extend from the first opening to the second opening for developing at least a space separated from the cooling medium passage and between the inner shell and the outer shell, and characterized by that the insulator is arranged to shut up a gap provided between the partition and the second opening.

A second example of the insulator according to the present invention is provided for use in a heating apparatus including at least a heating element, an inner shell for supporting the a heating element, an outer shell disposed along the outer boundary of the inner shell, a cooling medium passage for conveying a cooling medium between the inner shell and the outer shell, a first opening provided in the inner shell, a second opening provided in the outer shell, and a partition arranged to extend from the first opening to the second opening or from the second opening to the first opening for developing at least a space separated from the cooling medium passage and between the inner shell and the outer shell, and characterized in that the insulator is arranged to shut up a gap provided between the partition and the second opening or between the partition and the first opening.

The present invention is favorably applicable to a substrate processing apparatus for use in, for example, the oxidation or the diffusion, the reflow action, the annealing action, and the layer forming action by thermal CVD technique for planarization or activation of the carriers after the ion implantation over a semiconductor wafer on which semiconductor integrated circuit assemblies (semiconductor devices) are developed. The present invention is particularly advantageous in the processing action at lower temperatures of the substrate processing apparatus.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

The disclosure of Japanese Patent Application Nos. 2007-166997 and 2008-164357 filed on Jun. 25, 2007 and Jun. 12, 2008 respectively, including specification, drawings and claims is incorporated herein by reference in its entirety.

What is claimed is:

1. A heating apparatus comprising:
   a heating element;
   an inner shell that supports the heating element;
   an outer shell disposed along the outer boundary of the inner shell;
   a gas passage that provides a cooling gas to a heating space, the gas passage is formed by the inner shell and the outer shell between the inner shell and the outer shell;
   a first opening provided in the inner shell;
   a second opening provided in the outer shell;
   a partition that defines a box extending from the first opening to the second opening to form a separated space between the inner shell and the outer shell, the separated space being separated from the gas passage by the partition; and an insulator that shuts up a gap provided between the box and the second opening,
   wherein at least a part of a temperature detector is disposed in the separated space, the temperature detector comprises a thermocouple contact that detects the temperature of the heating element, the thermocouple contact is installed between the heating element and the inner shell.

2. A heating apparatus according to claim 1, wherein the box and the temperature detector are spaced by a gap from each other.

3. A heating apparatus comprising:
   a heating element;
   an inner shell that supports the heating element;
   an outer shell disposed along the outer boundary of the inner shell;
   a gas passage that provides a cooling gas to a heating space, the gas passage is formed by the inner shell and the outer shell between the inner shell and the outer shell;
   a first opening provided in the inner shell;
   a second opening provided in the outer shell;
   a partition that defines a box extending from the first opening to the second opening or from the second opening to the first opening between the inner shell and the outer shell, the box includes a separated space being separated from the gas passage by the partition; and
   an insulator that shuts up a gap provided between the box and the second opening or between the box and the first opening,
   wherein at least a part of a temperature detector is disposed in the separated space, the temperature detector comprises a thermocouple contact that detects the temperature of the heating element, the thermocouple contact is installed between the heating element and the inner shell.

4. A heating apparatus according to claim 1, wherein the insulator is implemented by two or more electrically insulating materials which are different in the rigidity and disposed in layers and at least one of the electrically insulating materials located at a box side is higher in the flexibility than the other electrically insulating materials.

5. A heating apparatus according to claim 1 or 3, wherein the second opening is arranged greater in the opening size than the first opening.

6. A heating apparatus according to claim 1, further comprising:
   a first opening shutting member that is disposed to provide a gap at the first opening.

7. A heating apparatus according to claim 6, further comprising:
   a temperature detector that detects the temperature of the heating element; and
   a support that supports the temperature detector,
   wherein the insulator is disposed between the second opening and the support.

8. A substrate processing apparatus having a heating space provided in the heating apparatus defined in claim 1 or 3, comprising:
   a reactor container disposed in the heating space that processes a substrate.

9. A heating apparatus according to claim 1, comprising an outer flange that supports the temperature detector and is attached to the outer shell to close the second opening.

10. A heating apparatus according to claim 9, the partition is arranged between the outer shell and the outer flange and at least partially closes the second opening.

11. A heating apparatus according to claim 1, a temperature of an atmosphere in the gas passage and a temperature of an atmosphere in the box are approximately equal.

12. A heating apparatus according to claim 1, the heating apparatus further comprises an inner flange that serves as a cover that covers the first opening forming a gap in the first opening.

13. A heating apparatus according to claim 1 or 3, wherein the insulator is implemented by two or more electrically insulating materials which are different in the rigidity and disposed in layers.

14. A heating apparatus according to claim 3, wherein the box and the temperature detector are spaced by a gap from each other.

15. A heating apparatus according to claim 3, comprising an outer flange that supports the temperature detector and is attached to the outer shell to close second opening.

16. A heating apparatus according to claim 15, the partition is arranged between the outer shell and the outer flange and at least partially closes the second opening.

17. A heating apparatus according to claim 3, a temperature of an atmosphere in the gas passage and a temperature of an atmosphere in the box are approximately equal.

18. A heating apparatus according to claim 3, the heating apparatus further comprises an inner flange that serves as a cover that covers the first opening forming a gap in the first opening.

* * * * *